United States Patent
Lachance-Quirion et al.

(10) Patent No.: US 11,402,455 B2
(45) Date of Patent: Aug. 2, 2022

(54) SYSTEM AND METHOD FOR SENSING SPIN

(71) Applicant: SOCPRA SCIENCES ET GENIE S.E.C., Sherbrooke (CA)

(72) Inventors: Dany Lachance-Quirion, Tokyo (JP); David Roy-Guay, Sherbrooke (CA); Michel Pioro-Ladrière, Sherbrooke (CA); Gregory Brookes, Laval (CA); Jérôme Bourassa, Sherbrooke (CA)

(73) Assignee: SOCPRA SCIENCES ET GENIE S.E.C., Sherbrooke (CA)

( * ) Notice: Subject to any disclaimer, the term of this patent is extended or adjusted under 35 U.S.C. 154(b) by 54 days.

(21) Appl. No.: 17/265,265

(22) PCT Filed: Aug. 1, 2019

(86) PCT No.: PCT/CA2019/051056
§ 371 (c)(1),
(2) Date: Feb. 2, 2021

(87) PCT Pub. No.: WO2020/028976
PCT Pub. Date: Feb. 13, 2020

(65) Prior Publication Data
US 2021/0208231 A1    Jul. 8, 2021

Related U.S. Application Data

(60) Provisional application No. 62/716,456, filed on Aug. 9, 2018.

(51) Int. Cl.
*G01R 33/60*    (2006.01)
*G01N 24/10*    (2006.01)
*G01R 33/32*    (2006.01)

(52) U.S. Cl.
CPC .............. *G01R 33/60* (2013.01); *G01N 24/10* (2013.01); *G01R 33/323* (2013.01)

(58) Field of Classification Search
CPC ....... G01N 24/10; G01R 33/323; G01R 33/60
See application file for complete search history.

(56) References Cited

U.S. PATENT DOCUMENTS

2008/0272775 A1* 11/2008 Feng .................. G01R 33/60
                                                   324/307
2017/0214410 A1*  7/2017 Hincks ................ G06F 13/36
(Continued)

FOREIGN PATENT DOCUMENTS

| EP | 0296833 A1 | 12/1988 |
| WO | 2016139419 A1 | 12/2016 |
| WO | 2017173548 A1 | 10/2017 |

OTHER PUBLICATIONS

Bulletin of the American Physical Society—APS March Meeting 2018—Monday-Friday, Mar. 5-9, 2018; Los Angeles, California—Session L55: Quantum Dot/Microwave Photon Entanglement—Abaraham Asfaw—http://meetings.aps.org/Meeting/MAR18/Session/L55.7 [retrieved from Internet Jul. 19, 2018].

(Continued)

*Primary Examiner* — Jay Patidar
(74) *Attorney, Agent, or Firm* — Alexandre Daoust; Norton Rose Fulbright Canada LLP

(57) ABSTRACT

A magnetic field causing a difference of energy level between different spin states in the sample can be applied, a spin transition in the material can be triggered by exposing the sample to electromagnetic radiation of an energy level corresponding to the difference in energy level between the different spin states, a sensing surface of a superconducting element can be exposed to a magnetic field of the spins in the sample, the spin transition can cause, via kinetic inductance, a change in electromagnetic waves carried by the superconducting element which can be detected. A magnetic field (Continued)

component normal to the sensing surface, below a certain magnetic field threshold, can be applied to favor sensitivity.

12 Claims, 14 Drawing Sheets

(56) References Cited

U.S. PATENT DOCUMENTS

2019/0018078 A1   1/2019  Nelson
2019/0277842 A1   9/2019  Cleveveland et al.

OTHER PUBLICATIONS

SKIFFS: Superconducting Kinetic Inductance Filed-Frequency Sensors for Sensitive Magnetometry in Moderate Background Magnetic Fileds—A. T. Asfaw et al.—Department of Electrical Engineering, Princeton University, Princeton, New Jersey, 08544, USA—Dated Jul. 27, 2018.

* cited by examiner

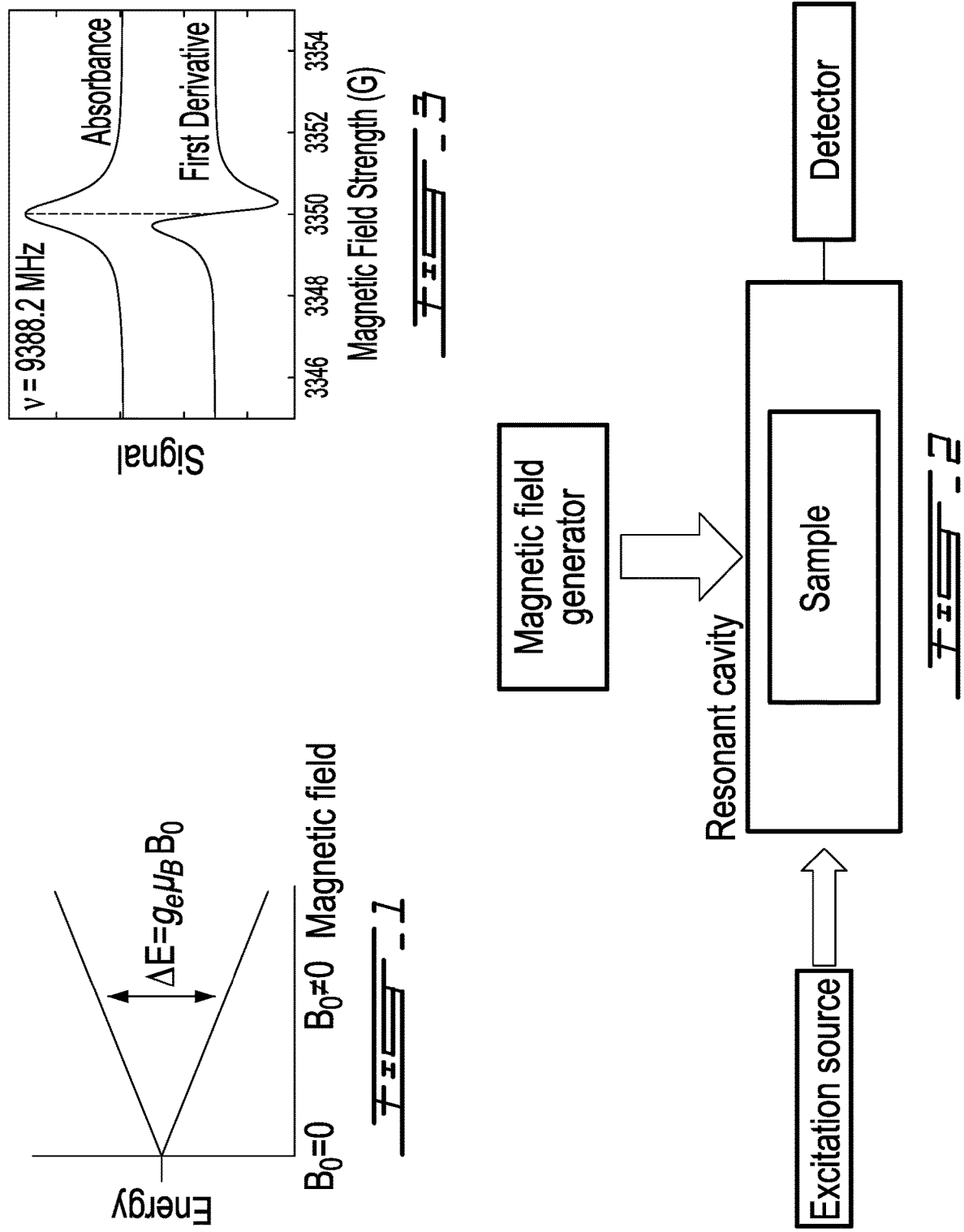

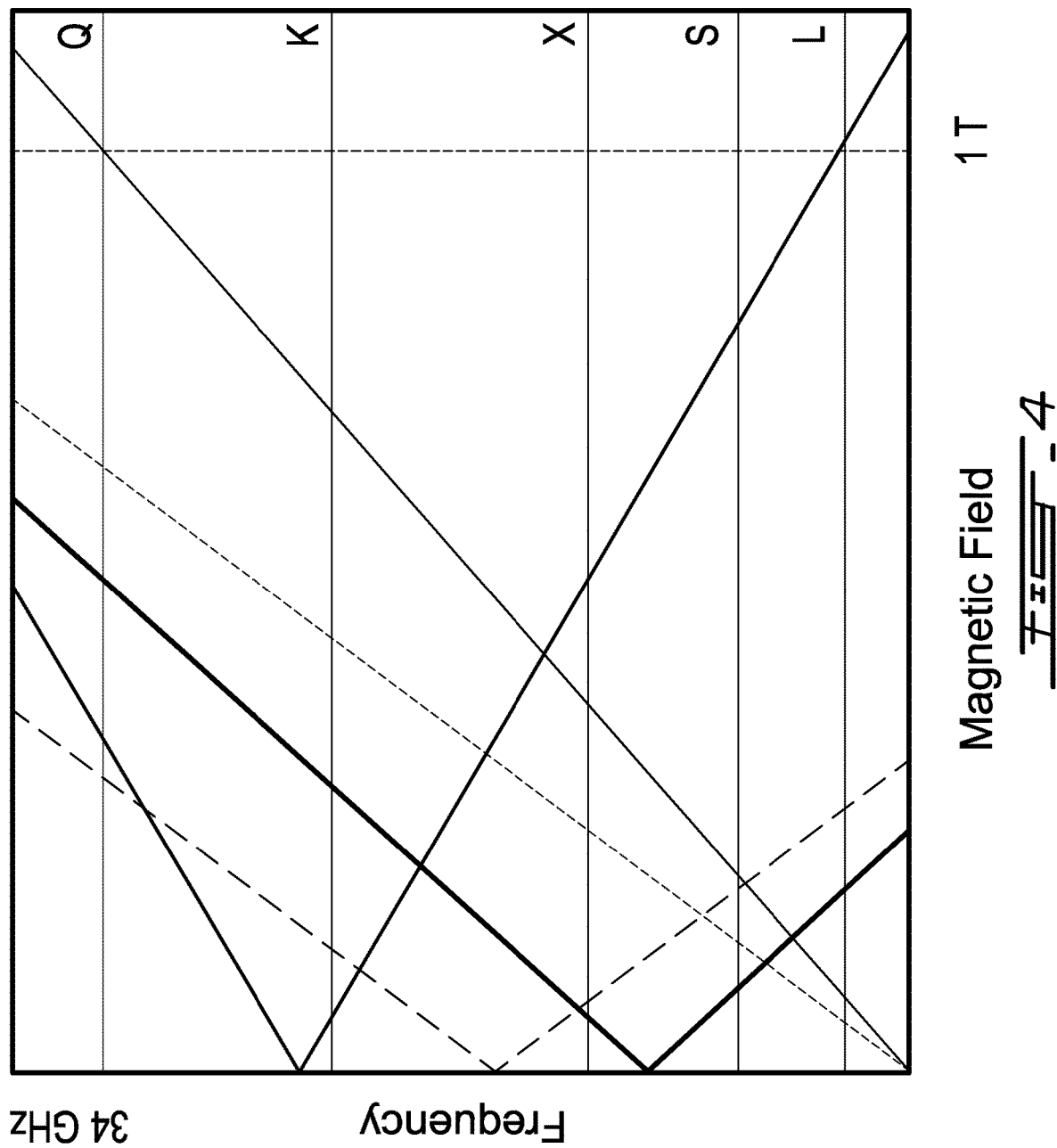

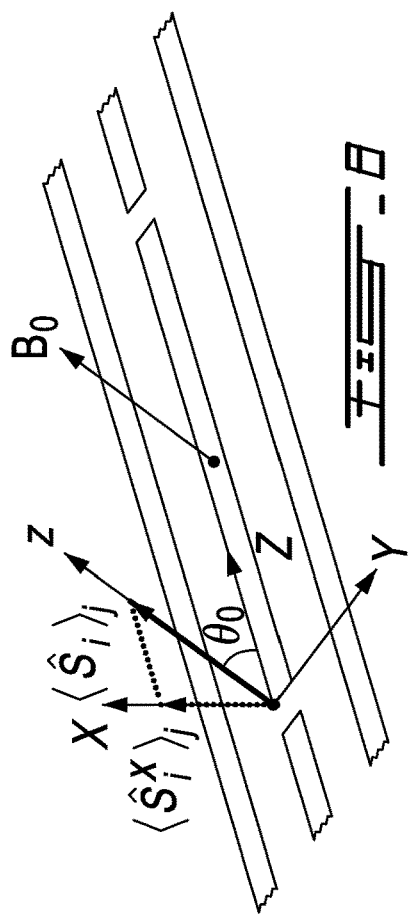
FIG. 8
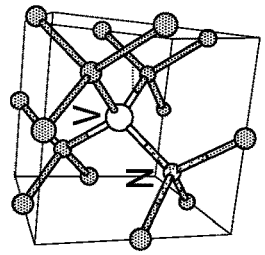
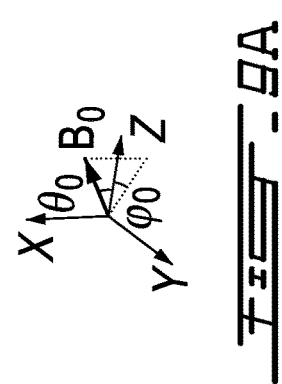
FIG. 9A
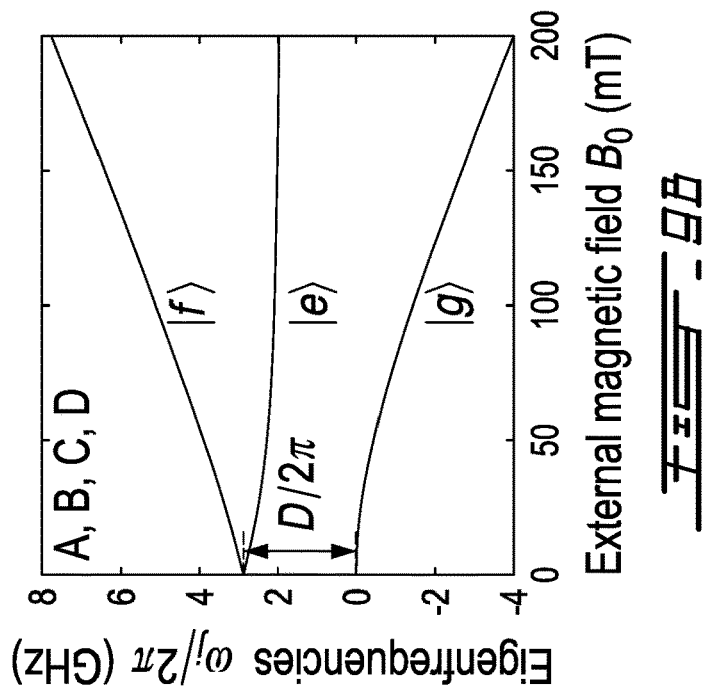
FIG. 9B

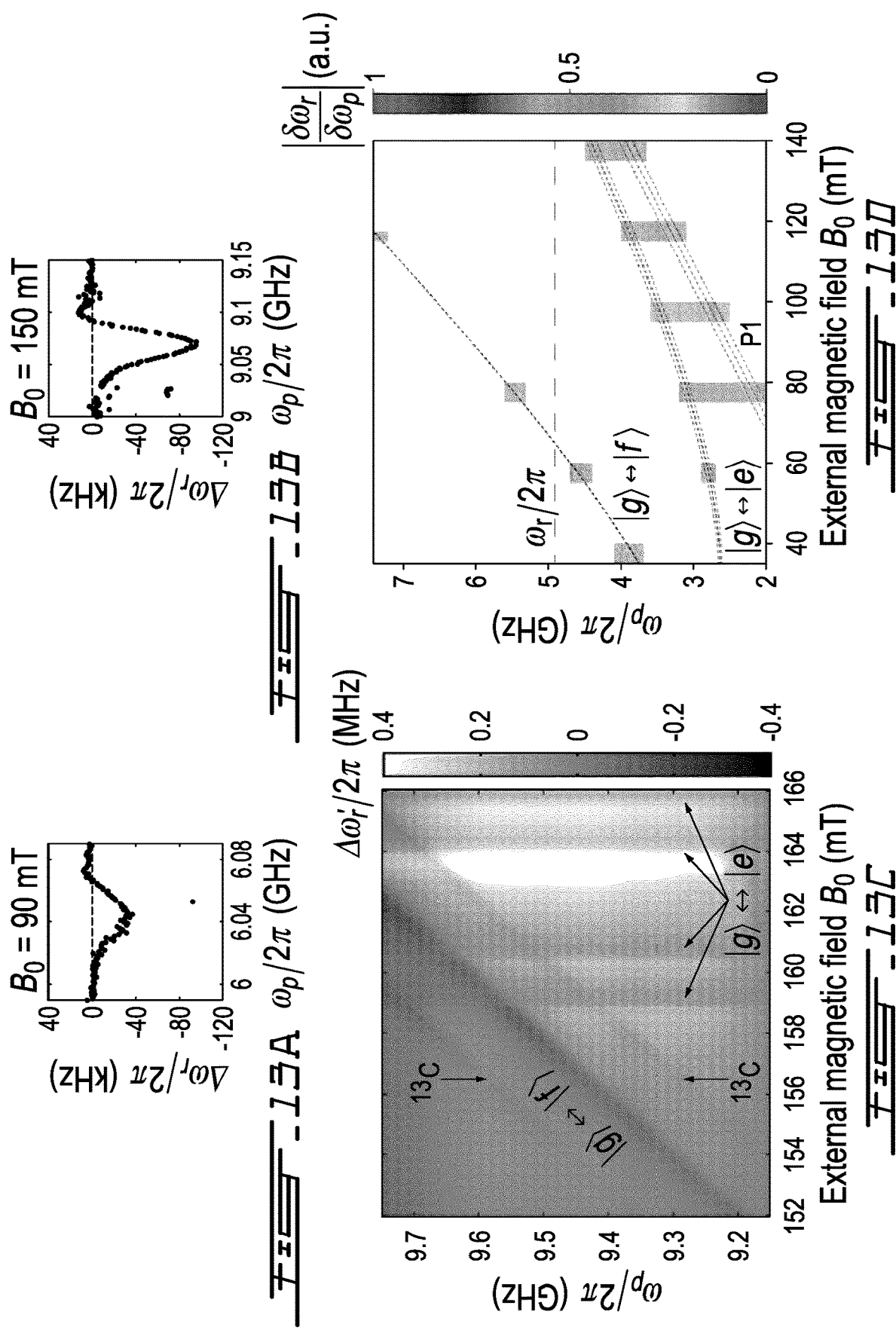

SYSTEM AND METHOD FOR SENSING SPIN

BACKGROUND

It was known to sense electron spin orientation using electron spin resonance spectroscopy (ESR). Electron spin resonance spectroscopy is based on the fact that when electrons are exposed to a magnetic field, the magnetic field creates a difference in the energy level between different spin states. For many spin species, the relationship between the difference in the energy levels of the different spin states is linearly proportional to the strength $B_0$ of the magnetic field, such as illustrated in FIG. 1, according to the relationship $DE=g_e\mu_B B_0$, where $g_e$ is the electron's g-factor and $\mu_B$ is the Bohr magneton. Electron spins can be stimulated to flip from the lower energy level spin state to a higher energy level spin state by electromagnetic radiation of energy $h\omega=g_e\mu_B B_0$, where $\omega$ is the frequency and is the reduced Plank's constant.

In a typical electron resonance spectrometer, schematized at FIG. 2, the sample having the electrons is placed in a resonant cavity and interact with the cavity field by means of a magnetic-dipole interaction, or transversal interaction. The cavity is driven by an excitation source to carry electromagnetic waves at its resonance frequency ( ), which is typically in the microwave region of the electromagnetic spectrum. Such electromagnetic waves are typically referred to as Radio-Frequency (RF) electromagnetic waves. The spectroscopy of the sample is done primarily by varying the strength of the magnetic field. When an electron spin species in the sample approaches the resonance condition with the cavity, the transversal interaction induces a shift of the cavity resonance frequency dependant on the spin state. The transition in the spin state can then be inferred from the change of amplitude and/or phase of the transmitted and/or reflected signal impinging on the cavity. FIG. 3 represents such a scenario, where the spectroscopy of the sample is done by varying the magnetic field strength.

Turning now to FIG. 4, numerous species of electron spins exist, and often even co-exist in a given material. Free electrons, for instance, will naturally align with the magnetic field and will typically have transition frequencies with linear relationship with the magnetic field strength with a slope given by the g-factor. Electrons which are not free may have nonlinear relationships with the magnetic field strength and may have a finite transition frequency at zero magnetic field, for instance.

It will be understood that with an electron resonance spectrometer such as shown in FIG. 2, only a horizontal line of the graph in FIG. 4 can be observed, the horizontal line being tied to the resonance frequency of the resonant cavity and having a width that is dependent on the transversal coupling strength and cavity linewidth, such as schematized in FIG. 5. Indeed, while the magnetic field strength can be varied to perform spectroscopy along the horizontal line and detect changes in amplitude and/or phase in the transmitted or reflected excitation electromagnetic wave at certain values of magnetic field strength for a given resonance frequency, the resonance frequency of the resonance cavity is fixed. More information can be obtained by scanning along another horizontal line, but this required using a different resonance cavity which operated at a different resonance frequency, and was therefore time-consuming, costly, and/or cumbersome.

In practice, transversal coupling occurs between the spins and the electromagnetic waves in the cavity, and as long as the conditions are close to the spin transition frequency, the electron spins will enter a resonance condition with the cavity where they exchange energy with the cavity field and the cavity frequency will shift depending on the spin state. This can allow a narrowband scanning along excitation frequency, schematized by the fact that short oblique lines, rather than spots, are illustrated in the different resonant cavity "windows" illustrated in the graph of FIG. 5. In any event, this transversal coupling effect only occurs when close to a spin transition frequency and provides limited information, constrained to the narrowband window around the resonant cavity being used.

This limited amount of information was found useful to a certain degree. Indeed, in many cases, one can expect certain "signatures" to be present in association with given electron spin species associated with given samples, in a context where the relationship between the transition condition, frequency and magnetic field strength of such electron spin species have already been characterized. Such signatures can be in the form of intensity dips or changes in phase associated to specific magnetic field strengths. There nonetheless remained room for improvement.

SUMMARY

The development of quantum technologies has accelerated in recent years and is expected to continue in years to come. With it comes a need to characterize spin species and spin excitations in many new quantum materials which have not yet been characterized, providing significant challenges for current-day technology. Indeed, some spin species in such quantum materials do not have a linear magnetic field strength vs. frequency relationship, such as schematized in FIG. 6. Also, some quantum materials exhibit novel surface spin excitations (distinct from their bulk properties), that have a transversal interaction strength to a cavity field that would be too weak to be resolved in practice. Attempts to characterize the spin species or spin excitations of such materials with electron resonance spectrometers such as shown in FIG. 2 positions the limitations of such spectrometers in greater evidence than ever before, creating a need for improvement. It was unsatisfactory, for instance, that such spectrometers were limited to scanning materials along the magnetic field strength axis, with only narrowband scanning along the frequency axis. This need was not limited to the characterization of electron spin, but also existed for the characterization or detection of other types of spin excitations in quantum materials and quantum circuits as well.

A new technique was developed which, in at least some embodiments, now allows scanning materials along a wider band of the frequency axis. This new technique is based on the fact that transitions of spin in a sample can produce a change in the magnetic field generated by the sample. It was discovered that such changes in the magnetic field could, depending on the spin state, increase or decrease the electrical inductance in a superconducting (also referred to as supra conducting) element when the superconducting element was exposed to the magnetic field of the spin species and exhibited a high kinetic inductance. This "longitudinal" coupling can produce measurable effects on the phase and/or amplitude of electromagnetic waves conveyed in the superconducting element, which could be detected as a source of information on spin states.

This new technique can perform satisfactorily when it is executed while applying a magnetic field with a main component oriented in the kinetic inductance plane of the sensing surface of the superconducting element, and a minor component normal to the kinetic inductance plane. The spin transition could still be triggered using electromagnetic radiation, and the superconducting element could be a resonator, for instance, but the new technique does not require the spin transition to be at the resonance frequency of the superconducting resonator, opening the door to wideband frequency scanning at a fixed magnetic field.

A simplified block diagram of a system of sensing electron spin based on this principle is shown in FIG. 7. Such a system can be equipped with a source of electromagnetic radiation for spin transition stimulation which has a variable frequency in addition to a source of magnetic field having a variable strength, which can allow to readily scan the sample in either one, or both of frequency and magnetic field strength.

It was found that such a system could operate dominantly via the longitudinal coupling principle, as opposed to the transversal coupling principle which was dominant in an electron resonance spectrometer such as schematized in FIG. 2. Indeed, longitudinal coupling can lead to both positive and negative change in resonator frequency $\Delta\omega_r$ depending on the spin state. By contrast, transversal coupling leads to a frequency shift whose sign depends on whether the spin transition frequency is above or below $\omega_r$. An example graph scanning frequency for a given magnetic field strength and containing a positive $\Delta\omega_r$ values is shown at the extreme right-hand side of FIG. 6. By contrast with transversal coupling, which occurs only when $\omega_r$ is near the spin transition frequency, longitudinal coupling operates independently of the proximity between $\omega_r$ and the spin transition frequency, thereby allowing broadband frequency scanning.

It was found relevant in many cases to use relatively large strengths of magnetic field to create sizeable gaps between different spin energy levels. On the other hand, while it was found relevant to have at least a portion of the magnetic field oriented normal to the kinetic inductance plane to achieve the longitudinal coupling effect, and while increasing the strength of the magnetic field normal to the kinetic inductance plane had the effect of increasing sensitivity to a certain extent, increasing the amplitude of the magnetic field normal to the kinetic inductance plane (hereinafter: transverse magnetic field) past a certain point could be counter-productive. Firstly, one must take into consideration the critical magnetic field strength of the superconducting element, past which the element will no longer exhibit superconductivity. In addition, for a superconducting resonator, past a certain threshold, the resonator frequency tends towards 0 and may become too low to be detectable. It can therefore be preferred to keep the strength of the transverse magnetic field below such a threshold. The thresholds beyond which such counter-productive effects begin to occur can vary based on various factors associated with the specific superconducting element selected for a given application.

In accordance with one aspect, there is provided a system for sensing spin transitions in a sample, the system comprising: a magnetic field generator configured to generate a difference of energy level between different spin states in the sample, an electromagnetic radiation source configured to induce a spin transition in the sample based on the difference in energy between the different spin states; a superconducting element configured to exhibit kinetic inductance and having a sensing surface exposable to the magnetic field of the spins in the sample in a manner for the spin transition to cause, via the kinetic inductance, a change in electromagnetic waves carried by the superconducting element; and a detector configured to detect the change in the electromagnetic waves.

In accordance with another aspect, there is provided a method of sensing a magnetic field of a sample, said method comprising; exposing a sensing surface of a superconducting element to the magnetic field of the sample, said superconducting element having a perpendicular magnetic field threshold, exposing the sensing surface to a magnetic field having a component normal to the sensing surface being lesser than the perpendicular magnetic field threshold; longitudinally coupling the magnetic field of the sample to electromagnetic waves carried by the superconducting element via the kinetic inductance; and sensing a value indicative of at least one of phase and amplitude of the electromagnetic waves.

In accordance with another aspect, there is provided a method of sensing spin orientation in a sample, the method comprising generating a magnetic field causing an energy difference between different spin states in the sample, triggering spin transition in the sample by exposing the sample to electromagnetic radiation of frequency corresponding to the difference in energy between the different spin states; exposing a sensing surface of a superconducting element to a magnetic field of the spins in the sample, the spin transition causing, via the kinetic inductance, a change in the electromagnetic waves carried by the superconducting element; and detecting the change using a detector.

In accordance with another aspect, there is provided a method of sensing spin orientation in a sample, the method comprising generating a magnetic field causing an energy difference between different spin states in the sample, triggering spin transition in the sample by exposing the sample to electromagnetic radiation of frequency corresponding to the difference in energy between the different spin states; exposing a sensing surface of a superconducting element to a magnetic field of the spins in the sample, the inversion of electron spin orientation causing, via kinetic inductance, a change in electromagnetic waves carried by the superconducting element; and detecting the change using a detector.

In accordance with still another aspect, the sensitivity to out-of-plane magnetic fields of the frequency of a superconducting resonator with a high kinetic inductance is used to measure the spin state, therefore realizing a quantum non-demolition readout of the spin system through an effective longitudinal coupling. This measurement technique for spin systems can be compatible with circuit QED architectures and could be used as an alternative to techniques based on transversal coupling in a wide range of applications.

Many further features and combinations thereof concerning the present improvements will appear to those skilled in the art following a reading of the instant disclosure.

DESCRIPTION OF THE FIGURES

In the figures,

FIG. 1 is a graph schematizing the increase in the difference of energy levels between opposite spin states with increasing magnetic field strength;

FIG. 2 is a simplified example of an electron spin resonance spectrometer;

FIG. 3 is a graph showing scanning of signal strength across magnetic field strengths, for a specific frequency;

FIG. 4 is a graph plotting the spin transition frequencies as a function of the magnetic field strength, for several spin species;

FIG. 8 is a schematic illustration, in accordance with an example, of a superconducting resonator in the presence of an external magnetic field $B_0[B_{0X}, 0, B_{0Z}]$ with an angle $\theta_0$. from the sensing surface, or kinetic inductance plane, such that $B_{0X}=|B_0|\sin\theta_0$ and $B_{0Z}=|B_0|\cos\theta_0$. The expectation value $\langle i|\hat{S}|i\rangle$ a free spin in state $|i\rangle$ has a component $\sin\langle i|\hat{S}_X|i\rangle = |\langle i|\hat{S}|i\rangle|\sin\theta_0$ perpendicular to the kinetic inductance plane, leading to an effective out-of-plane magnetic field.

FIG. 9A is a schematic illustration, in accordance with an example sample material, of a NV center in a unit cell of the diamond lattice oriented along the [1$\bar{1}$1] crystallographic axis. The four possible orientations, labelled from A to D, correspond to the four possible locations of the impurity nitrogen adjacent to the vacancy. The external magnetic field has angles $\theta_0$ and $\sigma_0$ from the Z axis.

FIG. 9B shows the eigenfrequencies $\omega_i/2\pi$ of a NV center as a function of the magnetic field amplitude $B_0$ with angles $\theta_0$-0.40° and $\sigma_0$--1.46° from the Z axis.

FIGS. 13A and 13B show spectrum of the $|g\rangle \leftrightarrow |f\rangle$ spin transitions. Amplitude $\Delta\omega_r/2\pi$ of the resonator frequency shift as a function of the pump frequency $\omega_p/2\pi$ near the spin transition $|g\rangle \leftrightarrow |f\rangle$ of NV centers for a magnetic field $B_0$ of (6A) 90 mT and (6B) 160 mT. For this spin transition, the different orientations of NV centers are not resolved.

FIG. 13C shows the uncalibrated amplitude of the resonator frequency shift $\Delta\omega_r'/2\pi$ as a function of $\omega_y/2\pi$ and the amplitude $B_0$ of the external magnetic field. Spin transitions of NV centers interacting through the hyperfine interaction with nuclear spins 1-½ of $^{12}$C are also visible. Furthermore, the crossing between spin transitions $|g\rangle \leftrightarrow |e\rangle$ and the resonator appear as vertical lines. The resonator frequency shift $\Delta\omega_y'/2\pi$ is not determined from a time-resolved measurement of $\delta\omega_r(t')$ but rather simply from $\Delta\omega_r'(B_0, \omega_y) = \omega_r(B_0, \omega_y) - \omega_r(B_0, \min[\omega_\theta])$.

FIG. 13D shows the spectra of the transitions $|g\rangle \leftrightarrow |f\rangle$ and $|g\rangle \leftrightarrow |e\rangle$ of the NV centers, as well as the transitions of P1 centers (free electrons of a substitutional nitrogen atom in the diamond lattice and hyperfine coupling to $^{14}$N) measured for different external magnetic fields. The color scale corresponds to the derivative of the resonator frequency with respect with the excitation frequency $\omega_p/2\pi$. For each value of the external magnetic field, a secondary magnetic field is used to compensate the in-plane field component. For clarity, the color scale is normalized for each dataset. Furthermore, the data is processed to remove spurious jumps of the resonator frequency and a moving average is performed. Note that the orientation of the sample is different than from previous data sets, as seen from the magnetic-field dependence of the transitions of the NV centers. For this experiment, the extracted values of the angles are $\theta_0$=0.7° and $\phi_0$=0.9°.

DETAILED DESCRIPTION

Figure 5:
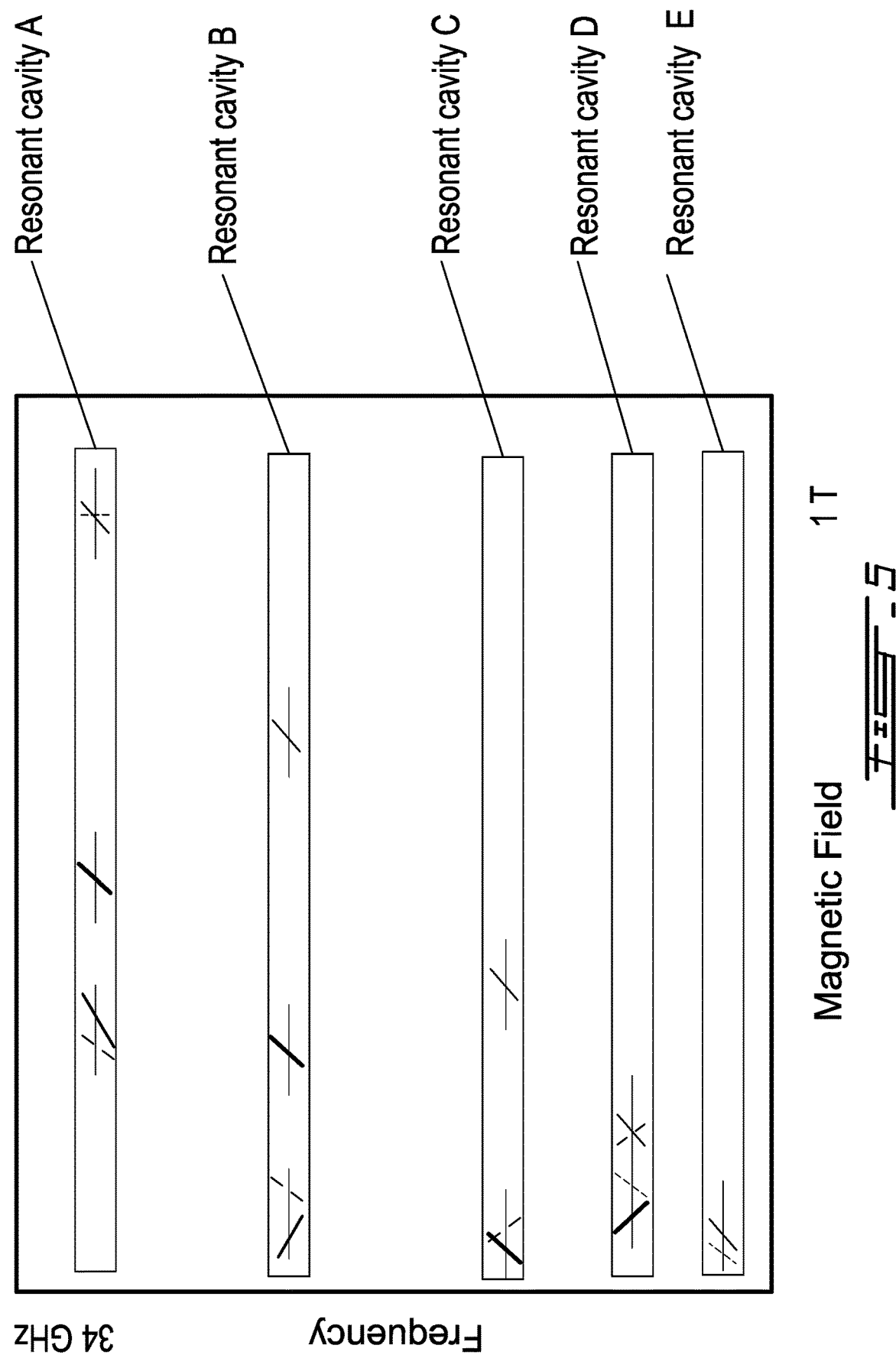
FIG. 5 is a graph illustrating the portions of the graph of FIG. 4 which can be perceived using an electron spin resonance spectrometer of FIG. 2, with resonant cavities of different resonance frequencies.

It was found that the magnetic field of spins can be longitudinally coupled to a high kinetic inductance resonator and directly influence its resonance frequency. Explanations of this phenomenon will follow, but the case of a conventional spin resonator system will first be explored.

Conventional ESR

In a conventional spin-resonator system, the fundamental mode of a λ/2 coplanar waveguide resonator of angular frequency $\omega_r$ is described by the Hamiltonian $$\hat{\mathcal{H}}_r = \hbar\omega_r \hat{a}^\dagger \hat{a}_r \quad (1)$$

where $a(a^\dagger)$ is the annihilation (creation) operator of a single photon in the resonator. A single spin $\hat{S}$ in an external magnetic field $B_0$ can be described by the Hamiltonian $$\hat{H}_s = g''\mu_B B_0 \cdot \hat{S} + \hat{H}_s', \quad (2)$$

where g'' is the Landé factor and $\mu_B$ is the Bohr magneton. While the first term of Eq. (2) simply describes the Zeeman effect, $\hat{H}_s'$ describes, for example, a zero-field splitting. In the spin eigenbasis, the Hamiltonian is given generally by $$\hat{\mathcal{H}}_s = \sum_i^{2S+1} \hbar\omega_i |i\rangle\langle i| \quad (3)$$

For a spin $\hat{S}$ at a position r from the central conductor of the resonator, a magnetic-dipole interaction will develop due to the resonator vacuum fluctuations. The interaction Hamiltonian is then $$\hat{H}_{int} = g''\mu_B(a^\dagger + a)\delta B(r) \cdot \hat{S}_r \quad (4)$$

where $\delta B(r)$ is the rms-amplitude of the magnetic field fluctuations at the spin position. If a spin transition of angular frequency $\omega_{ij} = \omega_j - \omega_i$ is near resonance with the resonator angular frequency $\omega_r$, i.e. $\omega_{ji} \approx \omega_r$, energy exchange between the spin and the resonator occurs and the spin state is not conserved. This type of interaction is transverse as it does not commute with the spin Hamiltonian.

In the spin eigenbasis, the system Hamiltonian can be expressed as $$\hat{\mathcal{H}} = \hat{\mathcal{H}}_s + \hat{\mathcal{H}}_r + \sum_i \sum_{j>i} \hbar g_{ij}(a^\dagger |j\rangle\langle i| + h.c.) \quad (5)$$

after performing the rotating-wave approximation. The coupling strength $g_{ij}$ of the resonator-induced transition $|i\rangle \leftrightarrow |j\rangle$ is given by $$\hbar g_{ij} = g^* \mu_B \delta B(r) \cdot \langle i|\hat{S}|j\rangle. \quad (6)$$

Far from resonance when $|\omega_{ij} - \omega_r| \gg g_{ij}$, the system enters the so-called dispersive regime where energy exchange is inhibited and the resonator acquires a spin-dependant frequency shift. This situation is similar to the dispersive shift between a transmon-type superconducting qubit and a microwave resonator, for example. Readout of the spin state can be made simply by measuring the amplitude and/or phase of a signal at the resonator frequency. While a full dispersive Hamiltonian could be obtained for all possible inter-level spin transitions, here we restrict our analysis on nearest level transitions where $1-l\pm 1$. In this simpler case, the system Hamiltonian of Eq. (5) is well approximated by the dispersive Hamiltonian $\hat{\mathcal{H}}_d$ given by $$\hat{\mathcal{H}}_d \approx \hat{\mathcal{H}}_s + \left(\hbar\omega_r + \sum_i \hbar\chi_i |i\rangle\langle i|\right) a^\dagger a \quad (7)$$

The off-resonant transverse interaction effectively pulls the resonator angular frequency by a spin-dependent shift given by $$\chi_i = \frac{g_{i-1,i}^2}{\Delta_{i,i-1}} - \frac{g_{i,i+1}^2}{\Delta_{i,i+1}}, \quad (8)$$

where $\Delta_{ij} = \omega_{ij} - \omega_r$ is the angular frequency detuning between the $|i\rangle \leftrightarrow |j\rangle$ spin transition and resonator angular frequencies. In particular, the resonator angular frequency difference resulting from the first spin transition $|g\rangle \leftrightarrow |e\rangle$ is given by (with g=1, e=2)

$$\Delta\omega_r = \chi_e - \chi_g = \frac{2g_{ge}^2}{\Delta_{ge}} - \frac{g_{ef}^2}{\Delta_{ef}} \quad (9)$$

For negative detunings ($\Delta_{ge} < 0$) and assuming that the $|g\rangle \leftrightarrow |e\rangle$ transition is further from resonance, ($|\Delta_{ge}| < |\Delta_{ef}|$) then the observed resonator angular frequency change is negative, i.e. $\Delta\omega_r < 0$.

For an ensemble of N degenerate spins, single excitations correspond to collective spin excitations in the spin ensemble. Considering their relative position from the center conductor, the average coupling strength is given by $$\bar{g}_{ij} = \frac{1}{\sqrt{N}} \left[\sum_{n=1}^N |g_{ij}^{(n)}|^2\right]^{1/2}. \quad (10)$$

The coupling strength with the spin ensemble is enhanced by a factor $\sqrt{N}$ due to the collective nature of the spin excitations in the ensemble. The system Hamiltonian is therefore well described by taking $g_{ij} \to \bar{g}_{ij}\sqrt{N}$. The strong coupling regime with coupling strengths $\bar{g}_{ij}\sqrt{N}/2\pi \approx 10$ MHz has been demonstrated in a few pioneering experiments.

However, given the strong dependence of the dispersive shift with the detuning, spin detection with the dispersive shift can only be done if the spin transition frequencies lie in the vicinity of the resonator frequency, typical ESR detection experiments rely on narrowband ~100 MHz detectors where the resonator is tailored for each specific types of spin transitions in a given sample.

Longitudinal Coupling—Theoretical Description

One way to overcome the limited bandwidth for the detection of spins is to make the resonator sensitive to the field fluctuations generated by the spin ensemble. To achieve this, a spin ensemble can be placed on top of a high-kinetic inductance resonator having a frequency sensitive to an applied magnetic field perpendicular to the kinetic inductance plane due to the nonlinear Meissner effect. In the presence of a spin ensemble, the resonator frequency will shift by a spin-dependent value which does not depend explicitly on the spin-resonator detuning. This interaction is longitudinal by contrast with the transverse interaction scheme referred to above.

In a specific embodiment, a uniform magnetic field bias $B_0$ is applied on the system in the [X, Y, X] laboratory frame, with the resonator being in the YZ-plane. Due to the nonlinear Meissner effect, the frequency of the high-kinetic inductance resonator depends quadratically with the perpendicular component of the magnetic field $B_{0X}$ according to $$\omega_r(B_{0X}) = \omega_r\left(1 - \alpha\left(\frac{B_{0X}}{B_m}\right)^2\right) \quad (11)$$

where $a=L_K'/(L_m+L_K')$ is the ratio between the kinetic inductance affected by the magnetic field, $L_K$, and the total resonator inductance $L_m+L_K$. Here $B_m$ is the characteristic threshold magnetic field for which the resonator angular frequency reaches zero, i.e. $\omega_r(B_m')\to 0$.

The magnetic field dependence of the frequency allows for the resonator to become highly sensitive to the quantum fluctuations provided by the spin ensemble. To illustrate the mechanism, consider a single spin in state $|i\rangle$ placed directly on top of the resonator. The perpendicular component of the magnetic field fluctuations applies to the resonator is then given by $$\Delta B_X(r) = B_X(r)\langle i|\hat{S}_X|i\rangle \quad (12)$$

where $\hat{S}_X$ is the projection of the spin operator along the X axis. The amplitude of the magnetic field fluctuations perpendicular to the kinetic inductance plane for a single spin at position r is given by $$\delta B_X(r) = \frac{g^x \mu_B \mu_0}{4\pi}\eta(r), \quad (13)$$

with $\mu_0$ being the vacuum permeability and $\eta(r)$ is a geometrical form factor.

As illustrated in FIG. 8, the perpendicular magnetic field $\Delta B_X(r)$ generated by the single spin is added to the external perpendicular magnetic field $B_{0X}$ according to $B_{0X}\to B_{0X}+\Delta B_X(r)$. We perform an expansion of Eq. (11) to first order in $\Delta B_X(r)$. The expected angular frequency shift for a single spin is then given by $$\delta_i \approx \frac{2\omega_r(0)B_{0X}}{B_m^2}\alpha' \delta B_X(r)\langle i|\hat{S}_X|i\rangle \quad (14)$$

Where $a'=a\delta A/A_r$ represents the kinetic inductance ratio that is affected by the spin covering a surface area $\delta A$ above the resonator surface of total area $A_r$.

In a general setting where the transverse spin-resonator interaction is also present in the dispersive regime, the Hamiltonian of a spin coupled to a high-kinetic inductance resonator is then given by $$\hat{H} = \hat{H}_s + \left(\hbar\omega_r - \sum_i \hbar\delta_i |i\rangle\langle i|\right)\hat{a}^\dagger\hat{a} + \hat{H}_{int}^x \quad (15)$$

Due the impinging magnetic fluctuations, the spin affects the resonator frequency with a spin-dependent quantity $\propto \delta_i |i\rangle\langle i|$. Given that the field amplitude in Eq. (13) scales as $\eta(r)\sim 1/|r|^8$ and decreases rapidly with the distance, the spin affects the resonator only locally over a surface of area $\delta A$. In proportion and for a resonator with total surface area $A_r$, the kinetic inductance affected by the spin fluctuations will scale as $l_K'\sim l_K\delta A/A_r$.

As we can see in Eq. (14), $\hat{e}_l$ is independent from the spin-resonator detuning contrary to the dispersive shift given by Eq. (8) resulting from an off-resonant transverse interaction. Since there is no preferable spin-transition frequency for detection, the longitudinal interaction allows for detection of spins over a broad frequency range limited only by the excitation frequency bandwidth. Indeed, the measurement bandwidth is fixed by the resonator frequency, not the frequencies of the spin transitions. Furthermore, this detection scheme is insensitive to parallel magnetic fields.

Extending to an ensemble of N degenerate spins, the collective excitations are distributed within the volume. Assuming that the distance between the ensemble and the resonator is much smaller than the ensemble dimensions, the field fluctuations of the ensemble are uniform and Eq. (12) remains valid. Hence, a single excitation radiates a magnetic field through an area $\delta A \to A_N$ on the resonator.

By defining the average magnetic field fluctuations on the resonator $\delta\overline{B}_X$ as $$\delta\overline{B}_X = \frac{1}{N}\sum_{n=1}^N \delta B_x(r_n) \quad (16)$$

and from Eq. (14), produces an average shift $\delta_i$ per spin. The frequency shift corresponding to a collective excitation in a spin ensemble is therefore enhanced by a factor N. Thus, a high-kinetic inductance resonator coupled to a spin ensemble will have an angular frequency shift between states $|g\rangle$ and $|e\rangle$ given by $$\Delta\omega_r\text{-}\sqrt{N}(\overline{X}_e\text{-}\overline{X}_g)\text{-}N(\overline{\delta}_e\text{-}\overline{\delta}_g). \quad (17)$$

where $X_i$ is the average dispersive shift caused by the average transverse coupling $\overline{g}_{ij}$. In this expression, we can appreciate the enhancement by a factor $\sqrt{N}$ of the longitudinal coupling compared to the transverse coupling.

Longitudinal Coupling—the Specific Case of NV Centers

While the coupling scheme described can be applicable to any type of magnetic moment, we will now focus on one possible example for the purpose of demonstration. As shown in FIG. 9A, a nitrogen-vacancy center (NV center) is a color defect in diamond composed of an adjacent nitrogen impurity and a vacancy. The spin S=1 of a single NV center in diamond is described by the Hamiltonian $$\hat{H}_{NV} = g^x\mu_B B_0 \cdot \overline{S} + hD\hat{S}_s^2 + hE(S_K^2 - S_y^2). \quad (18)$$

The first term describes the Zeeman splitting where $g''\approx 2$. The second term of Eq. (18) describes a zero-field splitting with $D/2\pi \sim 2.87$ GHz that lifts the degeneracy between the $|m_s=0\rangle$ and $|m_s=\pm 1\rangle$ spin states at zero field. A strain-induced splitting furthermore lifts the degeneracy between the $|m_s=\pm 1\rangle$ spin states at zero field with $E/2\pi \sim 5$ MHz. Here $\hat{S}$-$(\hat{S}_x, \hat{S}_y, \hat{S}_z)$ represents the Pauli matrices for a spin S=1.

The system of coordinates [x,v,z] is defined such that z points along the quantization axis of the NV center at zero magnetic field. Due to the crystalline symmetry, there are four equivalent crystallographic orientations of NV centers: [$\bar{1}\bar{1}\bar{1}$], [$\bar{1}11$], [$1\bar{1}1$], [$11\bar{1}$]. These orientations are later referred to as $\{A, B, C, D\}$ (FIG. 9A).

The Hamiltonian of Eq. (18) can be diagonalized for an arbitrary external magnetic field $B_0$. The diagonalized free spin Hamiltonian is therefore $$\hat{\mathcal{H}}_{NV} = \sum_{i=1}^{3} \hbar\omega_i |i\rangle\langle i| \quad (19)$$

with transition frequencies $\omega_{ij} = \omega_j - \omega_i$ for $l>1$. In particular, for a magnetic field along the Z axis, all four NV center orientations are affected in the same way by the magnetic field and their eigenfrequencies are degenerate. The presence of finite angles $\theta_0$ ($\varphi_0$) around the Y (X) axis in the external magnetic field lifts the degeneracy between the four orientations (FIG. 9A). Indeed, FIG. 9B shows the eigenfrequencies $\omega_i/2\pi$ obtained from the Hamiltonian of Eq. (18) with $l-\{g,q,f\}$ for a magnetic field of amplitude $B_0 \equiv |B_0|$ and finite $\theta_0$ and $\varphi_0$ angles.

Longitudinal Coupling—Experimental Proof with NV Centers

A summary of the experimental setup used as a proof-of-concept to detect the presence of spins using the longitudinal coupling between a spin ensemble and a resonator will now be presented, with additional details on the sample parameters and measurement techniques provided further below.

Figure 16A:
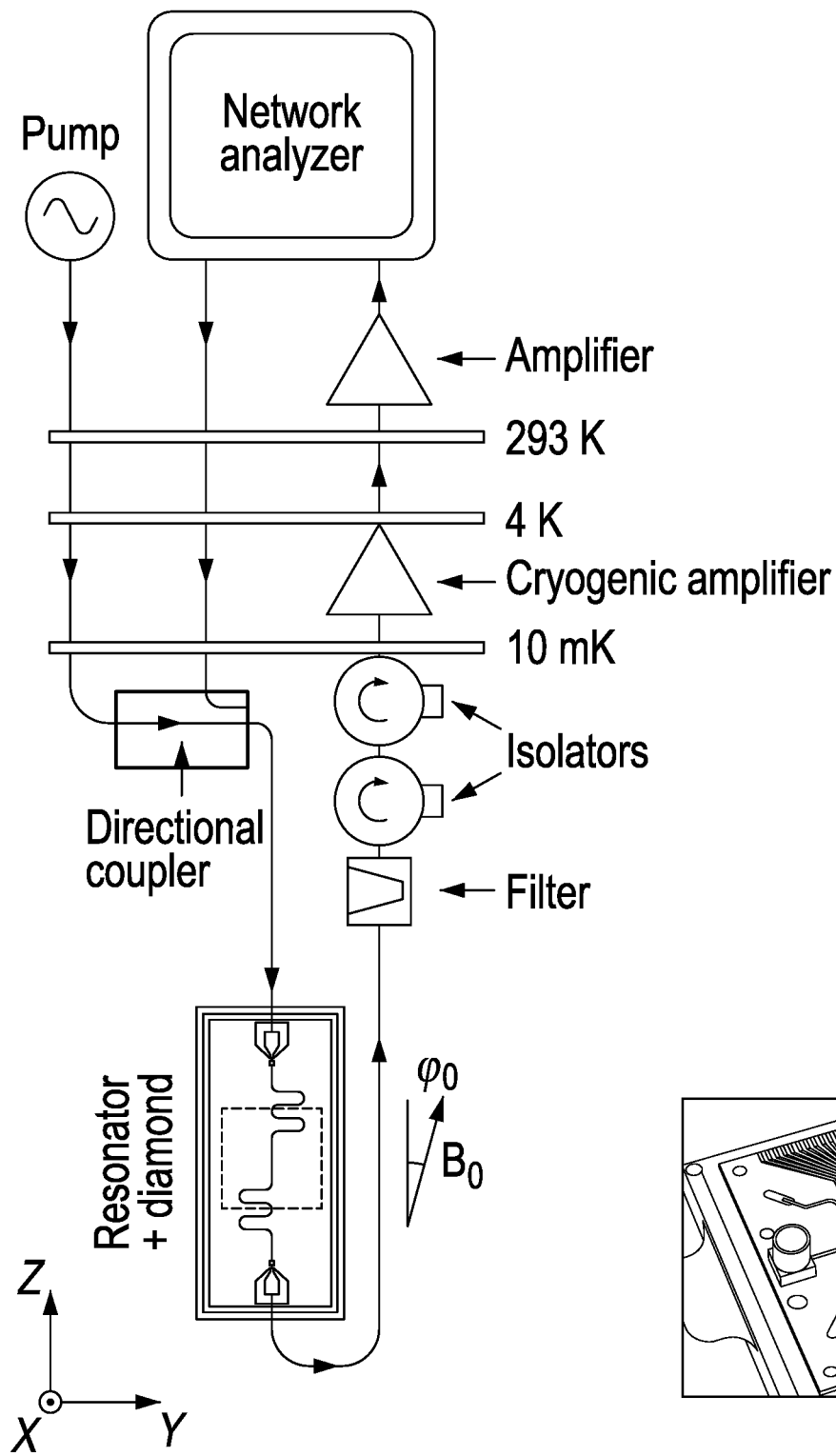
FIG. 16A schematizes an experimental setup of the resonator in a dilution refrigerator. A vector network analyser is used to measure the transmission at the spectroscopy frequency while a pump tone excites the spins. The magnetic field is tilted by an angle $\phi_0$ around the X axis and $\theta_0$ around the Y axis (not shown).
Figure 16B:
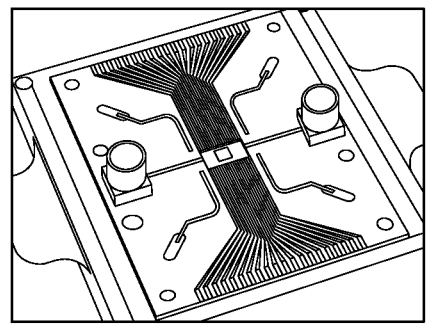
FIG. 16B is a photo of the diamond placed on top of the high-kinetic inductance niobium resonator. The red photoluminescence of the diamond under optical excitation with a 532 nm green laser is also shown.

The superconducting resonator consists of a 6 mm long coplanar waveguide resonator fabricated from a 18 nm thick niobium film on a insulating GaAs substrate with a impedance of $Z=97\Omega$. A CVD diamond sample with dimensions ($0.3 \times 1.5 \times 1.5$ mm$^3$) and containing of the order of $10^{15}$ NV centers per cm$^3$ is placed on top of the high-kinetic inductance resonator and fixed in place by vacuum grease (FIG. 16B). The sample is then placed in a dilution refrigerator at a base temperature T-10 mK. FIG. 16A shows the simplified experimental setup used in the experiment. A vector network analyzer is used to measure the transmission coefficient $t(\omega_e)$ of the resonator at a spectroscopy angular frequency $\omega_s$ and power $P_s$. A pump tone of angular frequency $\omega_p$ and power $P_p$ from a microwave source is combined to the spectroscopy tone at the mixing chamber with a directional coupler.

Three distinct experiments are made. In a first experiment, the resonator is measured in a perpendicular magnetic field, corresponding to $\theta_0$-90°. This allows us to determine the characteristic magnetic field $B_m$, which is required to estimate the magnetic field sensitivity. In a second experiment, the spectroscopy of the spin transitions of NV centers is carried by sweeping the amplitude of the magnetic field. Both the transverse and longitudinal couplings contribute to the signal. The angles $\theta_0$ and $\varphi_0$ between the external magnetic field and the plane of the resonator are fixed to $\theta_0$-0.48° and $\varphi_0$--1.46° as later determined through spectroscopy of the NV centers. Finally, in a third experiment, the frequencies of the spin transitions of NV centers are fixed at larger detuning values to further suppress the dispersive coupling. Additionally, the angles $\theta_0$ and $\varphi_0$ can be changed in situ by using a vector magnet. More specifically, this enables us to change the perpendicular bias field $B_{0X}$. At this detuning, the signal from the longitudinal coupling is dominant.

We characterize the high-kinetic inductance resonator without the presence of the diamond by measuring the resonator spectrum. With the frequency of the resonator extrapolated at zero temperature and from the waveguide geometry, we estimate the kinetic inductance participation ratio a-0.71, indicative of a high-kinetic inductance resonator (see further below). The measured resonator linewidth of $\eta/2\pi \approx 0.86$ MHz indicates that the resonator is under-coupled, as external and internal losses due to the GaAs substrate are estimated as approximately equal. Adding the diamond and grease decrease the resonator frequency from $\omega_r/2\pi \approx 5.115$ GHz to 4.984 GHz while the relaxation rate increases only slightly to $\eta/2\pi \approx 0.97$ MHz due to additional internal losses.

Figure 10B:
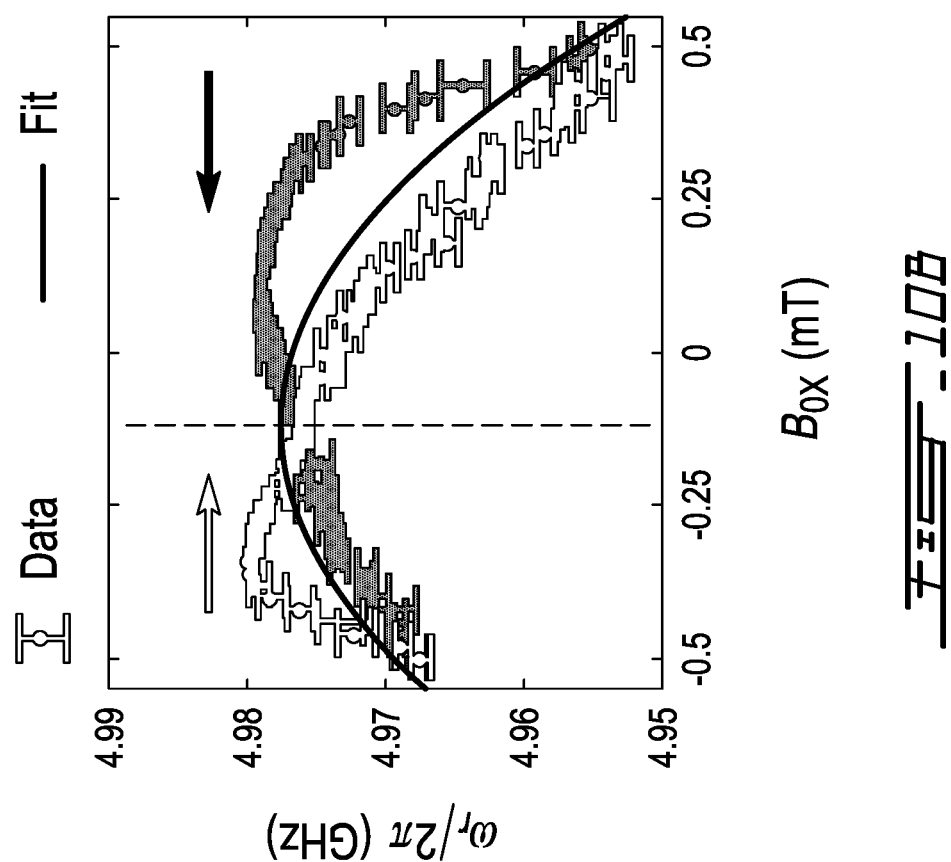
FIG. 10B shows the resonator frequency $\omega_i/2\pi$ while decreasing (blue dots) and increasing (red dots) the perpendicular magnetic field $B_{0X}$. The plain line corresponds to a quadratic fit from which the characteristic magnetic field is determined.
Figure 10A:
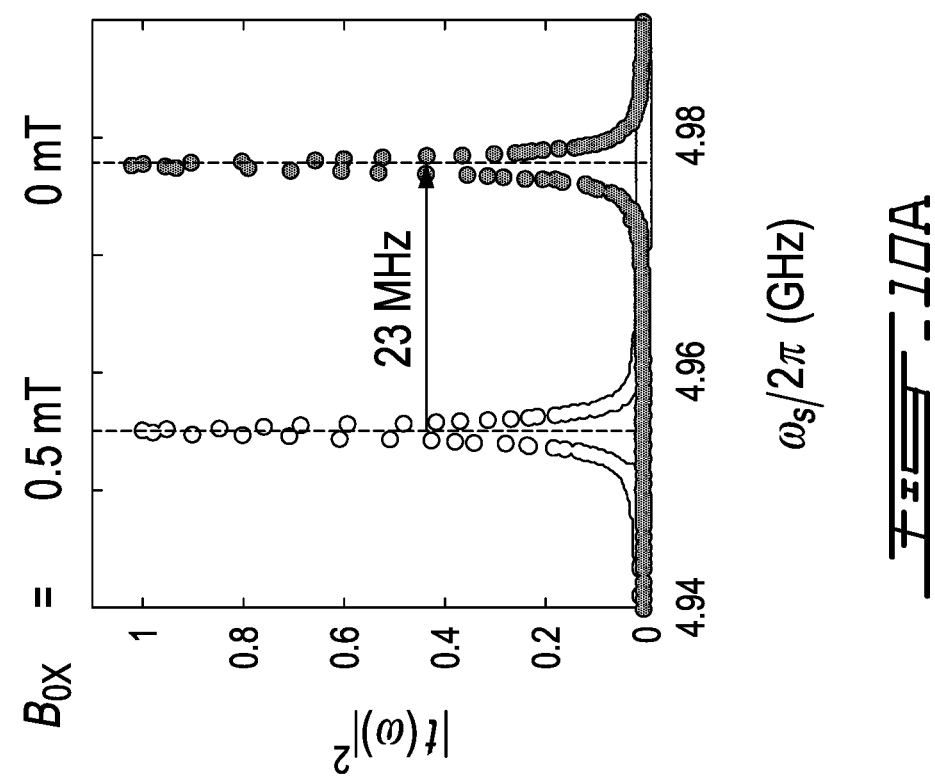
FIG. 10A shows the normalized amplitude $|t(\omega_e)|^2$ of the transmission coefficient as a function of the frequency of the spectroscopy tone $\omega_s/2\pi$ for perpendicular magnetic fields $B_{0X}$-0 (blue dots) and 0.5 mT (red dots).

In the first experiment, the resonator frequency dependence is calibrated in a perpendicular external magnetic field along the X axis $B_0 = B_{0X} e_X$. In FIG. 10A we show typical measurements of the resonator spectrum at $B_{0X}$-0 and 0.5 mT and see a resonator frequency shift of about 23 MHz, or more than 20 linewidths. From this Lorentzian response we extract both the resonator frequency $\omega''(B_{0X})/2\pi$ and linewidth $\eta/2\pi$. We then perform 500 such measurements with a time resolution of about 1 s for different values of the magnetic field. After averaging at each magnetic field value, we obtain the resonator frequency as a function of the applied field as shown in FIG. 10B. As we can see, the resonator frequency shows a quadratic dependence with the applied field expected from the nonlinear Meissner effect. From the fit we estimate that the characteristic field $B_m \approx 7.9$ mT and, along with a, is indicative of the high-kinetic inductance of the resonator. As such, the resonator is therefore highly sensitive to perpendicular fluctuations of the environmental magnetic field.

A consequence of such a sensitivity can be observed in the hysteresis of the resonance frequency caused by nearby vortices in the sample. In addition, we see that as we increase the magnetic field, the fluctuations of the resonance frequency become larger as indicated by the error bars, as expected from an increase of the kinetic inductance with $B_{0X}$. Considering that we can estimate the resonator frequency with a sensitivity of 0.9 kHz/$\sqrt{Hz}$ for a spectroscopy power $P_6=-87$ dBm$\approx 2$ pW, the magnetic field sensitivity around $B_{0X} \approx 0.5$ mT is approximately 20 nT/$\sqrt{Hz}$. This is a simple lower-bound estimate assuming that the magnetic field sensitivity is constant since in reality it increases with the perpendicular magnetic field, leading to a better sensitivity.

Figure 11A:
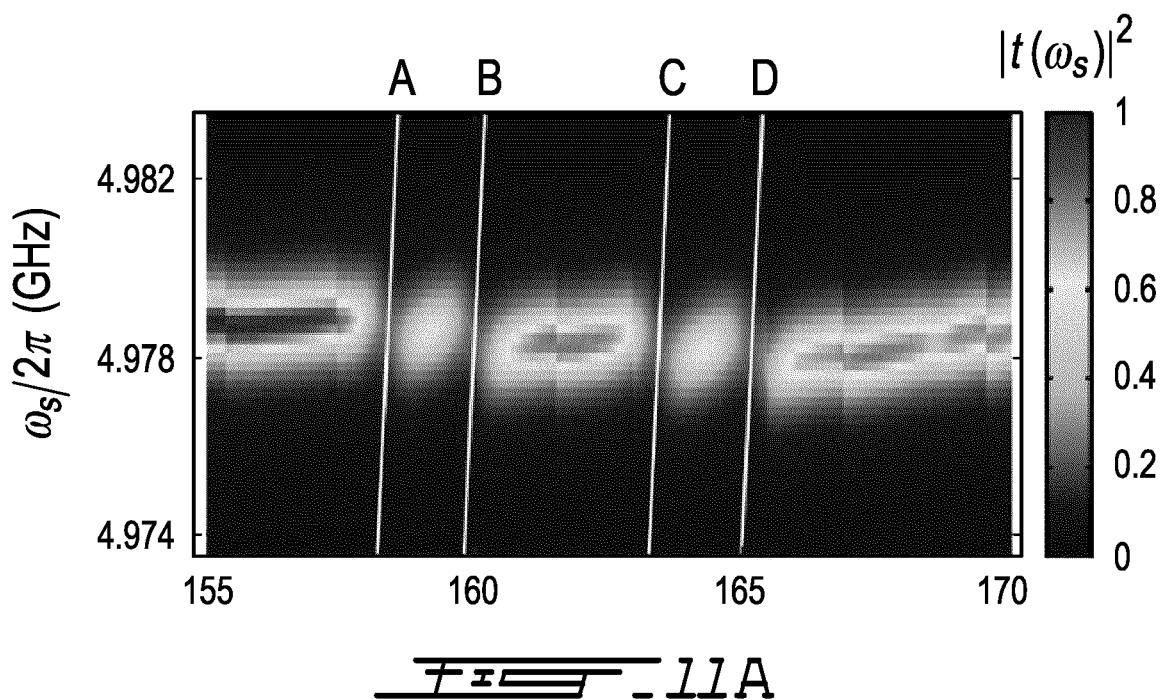
FIG. 11A shows the normalized transmission $|t(\omega\_s)|^2$ as a function of the spectroscopy frequency $\omega_s/2\pi$ and the amplitude $B_0$ of the external magnetic field in the vicinity of the resonator frequency for NV centers of orientation A (blue), B (red), C (green), D (purple).
Figure 11B:
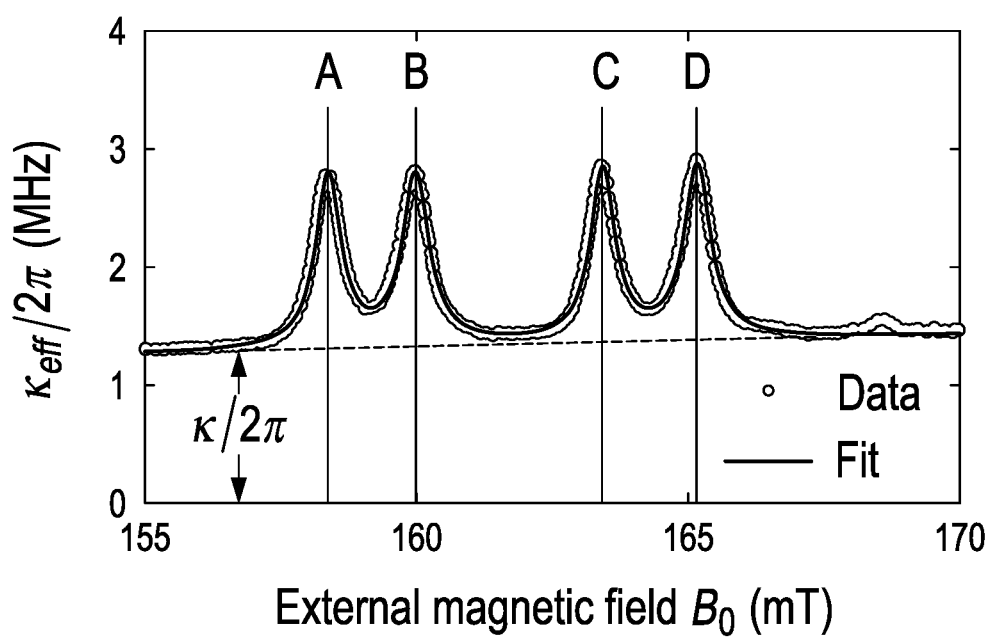
FIG. 11B shows the effective resonator linewidth $\eta_{eff}/2\pi$ as a function of $B_0$ extracted from the data shown in 4A. Plain line indicates the fit to the data considering that the intrinsic resonator linewidth increases linearly with $B_0$ (dashed grey line).

In a second experiment, to confirm the presence of a transverse interaction between the NV centers and the resonator, the resonator spectrum is measured as a function of a mostly in-plane magnetic field $B_0$ with angles $\theta_0$-0.48° and $\varphi_0$--1,46° (FIG. 11A). When the spin transition angular frequency of one of the four possible orientations is near resonant with the resonator angular frequency ($\omega_{ge} \approx \omega_y$), the transverse interaction $y_{gz}$ hybridizes the NV centers and the resonator. Here, the system is in the bad atom limit where the inhomogeneously-broadened linewidth of the spin transitions of NV centers are much larger than the resonator linewidth and the collective coupling strength. As shown in FIG. 11B, this results in a significant increase of the resonator linewidth from ~1.3 MHz to about 3 MHz when a spin transition is resonant with the resonator. In this regime, the transverse coupling strength $g_{ge}$ for each orientation of NV centers can be estimated by fitting the increase of the resonator linewidth and we find values of $g_{ge}/2\pi$-(2.27, 2.32, 2.22, 2.32) MHz for orientations (A, B, C, D) respectively. In both FIG. 11A and FIG. 11B, solid lines indicate numerically obtained frequencies $\omega_{ge}/2\pi$ for each NV center orientation from Eq. (18) using $D/2\pi$=2.87 GHz, $E/2\pi$=4.7 MHz, $\Delta B_0$=1.71 mT, $\theta_0$=0.48° and $\varphi_0$=−1.46°.

After demonstrating a spin-resonator transverse coupling, the dispersive regime where the spin transition frequency is far detuned from the resonator frequency preventing the exchange of energy, as discussed earlier, will now be explored. Still, the transverse coupling allows for a strong pump tone of angular frequency $\omega_y \approx \omega_{ij}$ to drive spin transitions between states |i⟩ and |j⟩ through the resonator. The pump tone changes the populations of the different eigenstates |j−{g, e, f}⟩ of the NV centers and can therefore be used to change the magnetization of the spin ensemble.

To perform an off-resonance readout of the NV centers, we first prepare a steady-state of the ensemble with a finite population in states |e⟩ or |f⟩ using a continuous pump tone around $\omega_y \approx \omega_{ge}$ or $\omega_{gf}$. After a few seconds, the pump angular frequency is switched to a reference angular frequency $\omega_g^a$, chosen such that it is off-resonant with any spin transitions. During that time, a spectroscopy tone at angular frequency $\omega_s$ measures the resonator angular frequency as a function of the time t, $\omega_y(t)$. During this free evolution, the NV centers excited state population decays to the ground state |g⟩ as $\sim e^{-t/T_1}$ with a relaxation time constant $T_1$ which can reach many hours at millikelvin temperatures. Due to the dispersive and/or longitudinal interaction with the resonator (see Eq. (17)), the decaying spin population will produce a transient signal in $\omega_r(t)$.

Figure 12B:
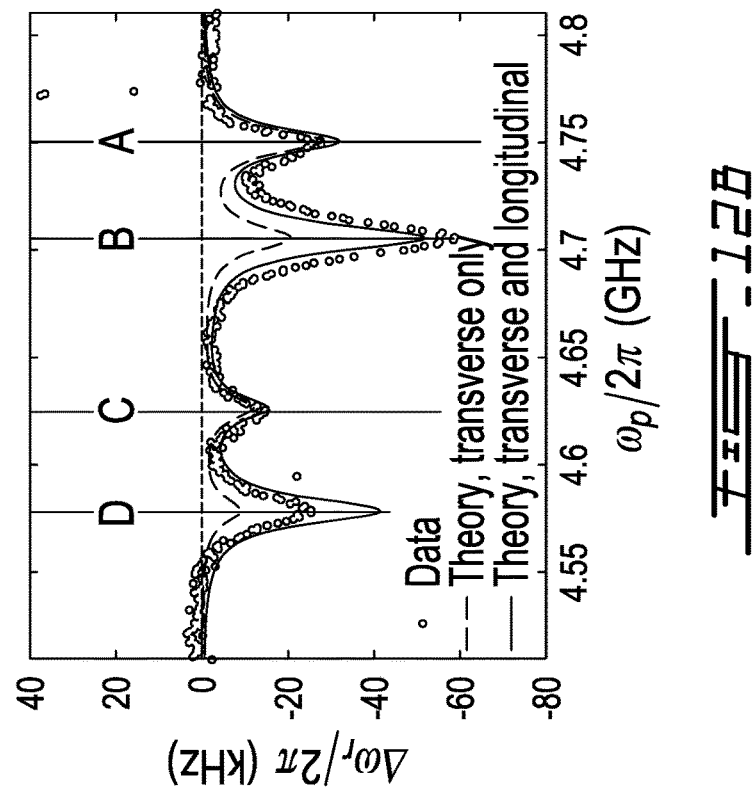
FIG. 12B shows the resonator frequency shift $\Delta\omega_r/2\pi$ as a function of the pump frequency $\omega_p/2\pi$ near the spin transitions of different the NV centers (black circles). Theoretical predictions considering only the transverse coupling Eq. (5) (dashed red line) and considering both transverse and longitudinal coupling Eq. (15) (plain blue line) are shown. Vertical lines indicate the transition frequency for different spin orientations. For both figures, the magnetic field is fixed at $B_0$-150 mT.
Figure 12A:
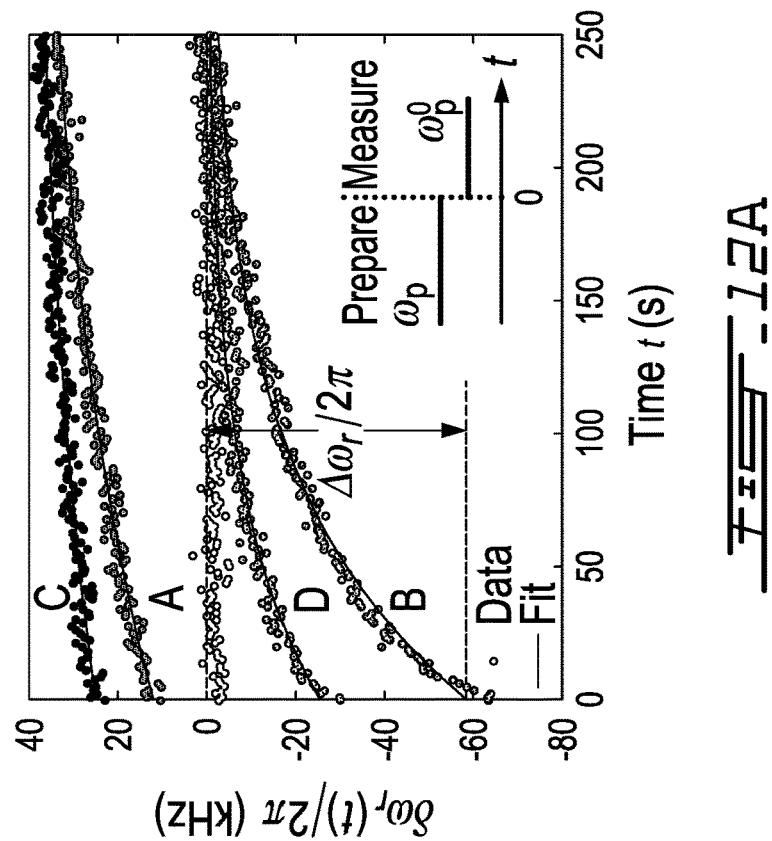
FIG. 12A shows the shift of the resonator frequency $\Delta\omega_r(t)/2\pi$ as a function of time t for a pump angular frequency resonant with for $\omega_{gs}$ centers of orientation A (blue), B (red), C (green), D (purple), and for $\omega_\theta/2\pi$-$\omega_\theta^0/2\pi$-4.51 GHz (grey). Plain lines are fits to the exponential decay of Eq. (20). Data for orientations A and C are vertically offset by 40 kHz for clarity. The amplitude $\Delta\omega_r/2\pi$ of the resonator frequency shift is indicated for orientation B. The inset schematically shows the sequence of angular frequencies of the pump tone used in the measurements.

In FIG. 12A we plot the measured resonator angular frequency shift $\delta\omega_r(t)\equiv\omega_r(t')-\omega_r^g$ when the pump tone is near resonance with the |g⟩↔|e⟩ transition of given NV center orientation. Here $\omega_y^g$-$\omega_y(t\to\infty)$ corresponds the resonator angular frequency when all the spins are in the ground state. As expected the resonator angular frequency shift shows an exponential decay $$\delta\omega_y(t')-\Delta\omega_y e^{-t/T_1} \quad (20)$$

with an amplitude $\Delta\omega_y$ and a decay time constant $T_1$. Fitting data shown in FIG. 12A to Eq. (20), we determine, for example, a relaxation time of $T_1$-80≅5 s and shift of $\Delta\omega_y/2\pi$-−59±1 kHz for NV centers of orientation B.

In FIG. 12B, $\Delta\omega_r$ is plotted as a function of the pump angular frequency $\omega_y$ for a fixed external magnetic field $B_0$-150 mT. Given that the field is slightly out-of-plane, the degeneracy between the NV center orientations is lifted as the frequency shift shows a sharp increase in magnitude when the pump is near resonant with either orientation. The magnitude of the frequency shift is seen to alternate between high and low values as the pump frequency increases or, conversely, as the magnitude of the detuning $|\Delta_{ge}|$-$|\omega_{ge}-\omega_y|$ decreases from 385 MHz to 215 MHz. We compare our results with theoretically predicted values from a transverse coupling model of Eq. (5) using the previously obtained experimental values of $\{B_0, g_{yu}, \omega_y, \eta, T_1\}$. To obtain the correct spin transition frequencies, we fit the field angles values at $\delta_0$-0.48° and $\varphi_0$-−1.46°. Our observations are in stark contrast with the behaviour expected from the transverse coupling as we should see the magnitude of the shift increase monotonously as $|\Delta\omega_y| \propto 1/\Delta_{ge}$ according to Eq. (8).

Figure 6:
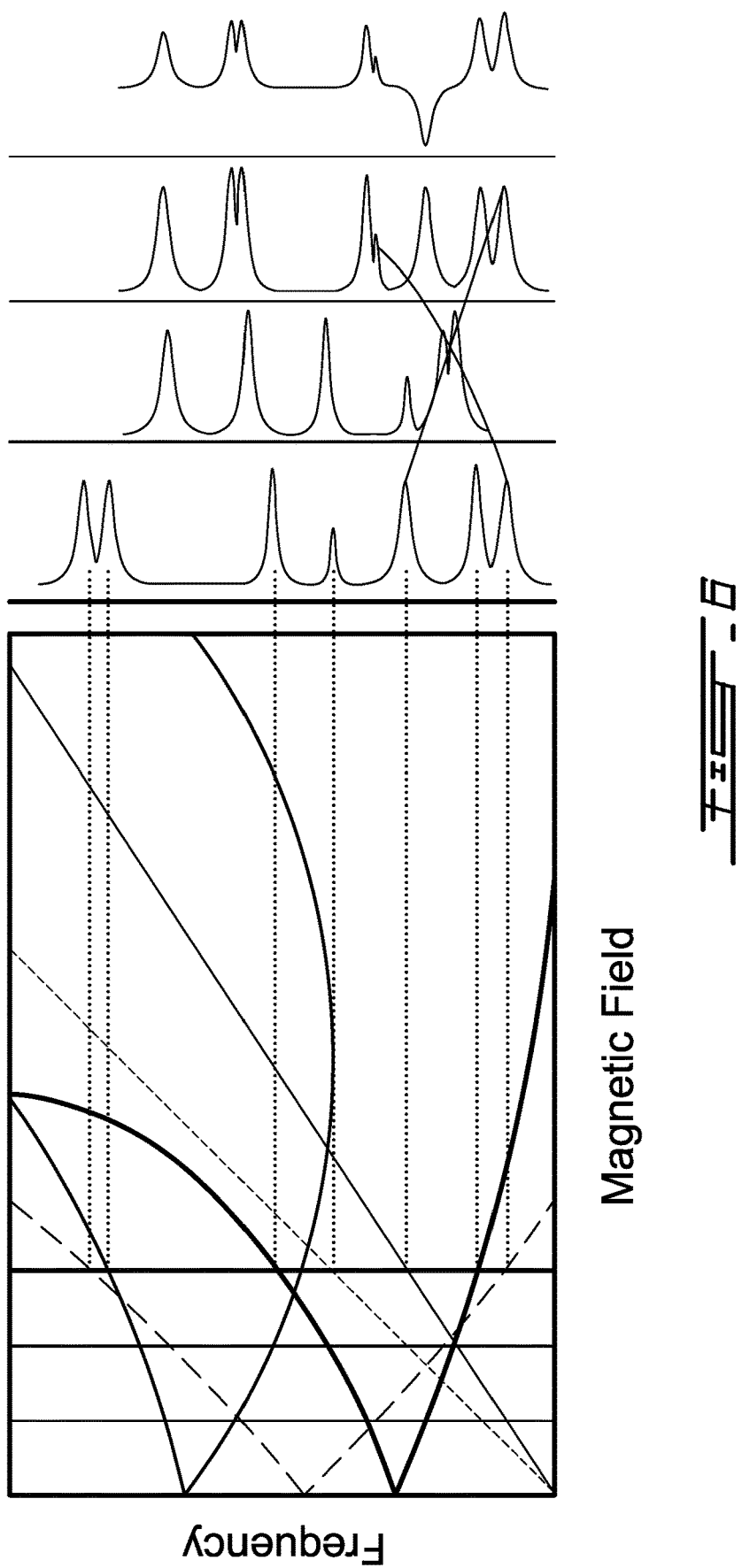
FIG. 6 is a graph plotting the spin transition frequencies across both excitation frequency and magnetic field strength, for several spin species, including spin species having non-linear frequency/magnetic field strength relationships, and on the right-hand side, frequency scans for different magnetic field strength values including an example graph containing a positive $\Delta\omega_r$ values at the extreme right-hand side.
Figure 7:
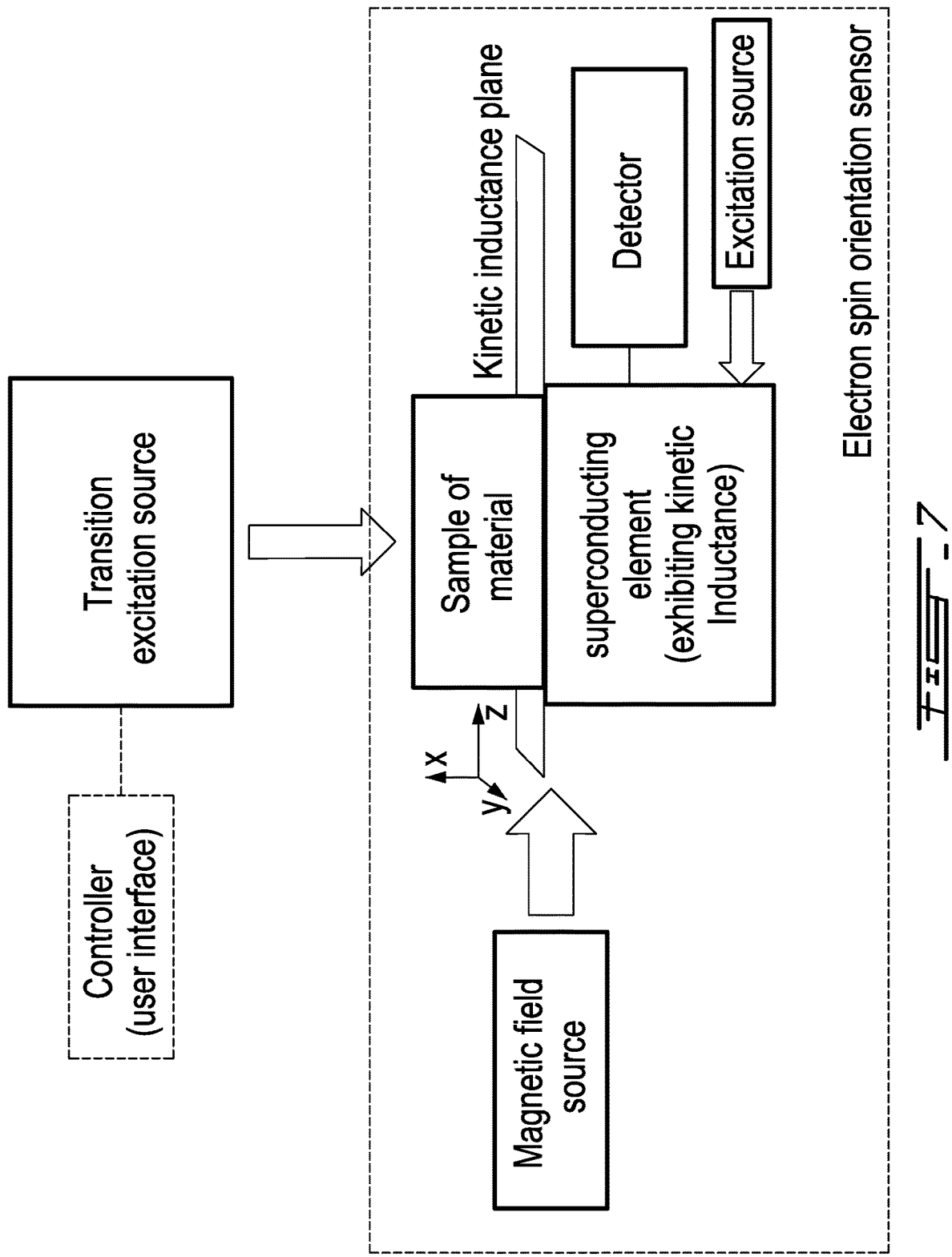
FIG. 7 is a simplified example of a system for sensing electron spin orientation.

In FIGS. 6A and B show the spectrum of the |g⟩↔|f⟩ spin transition for $B_0$-90 mT and 150 mT. Under only the transverse interaction and with the corresponding detunings of ~1.1 GHz and ~4.1 GHz respectively, theory predicts dispersive shifts around $\Delta\omega_y/2\pi$-+1.4 kHz and −55 kHz. These results indicate that transverse coupling cannot explain the observed shifts and hint at a longitudinal interaction is also at play. As previously discussed, the longitudinal frequency shift does not depend explicitly in the spin-resonator detuning. Since sensitivity of the resonator is increased with the perpendicular bias field $E_{0X}$-$B_0\theta\pi\theta_0$, the longitudinal coupling can increase the frequency shift even further. This demonstrates the strength of the longitudinal readout scheme to measure a spin transition over a very large frequency band, irrespective of the detuning with the resonator, as shown in FIG. 13C and FIG. 13D over more than 5 GHz. Again, this is in stark contrast with electron paramagnetic resonance, where a cavity needs to be resonant with the spin transition, therefore fixing the external magnetic field $B_0$.

To further demonstrate the presence of the longitudinal spin-resonator interaction scheme, FIG. 12B is now revisited under the system Hamiltonian Eq. (15) and the NV Hamiltonian Eq. (18). Considering that the sample covers about half of the resonator, a first assumption is that $A_N \approx \frac{1}{2}$. The data can then be fitted with the sample field fluctuations amplitude $\delta B_X$ as a fit parameter and we also take $\hat{S}_x \to \hat{S}_x + \zeta_Y \hat{S}_Y$ from Eq. (14) to better reflect the diamond and resonator geometry and the lack of uniformity of the coupling. The fit of the longitudinal coupling scheme with the data is represented in FIG. 12B with a plain blue line, with fit parameters $\zeta_Y \approx 0.8$ and $|\delta B_X \oplus| \approx 300$ nT. The latter is consistent with the magnetic field calculations from the spin ensemble placed at ~4 μm from the kinetic inductance plane (see below).

Using the same set of parameters, the longitudinal coupling with the |g⟩⟩|f⟩ transition in FIG. 13 is explored, and resonator shifts of −60 kHz at $B_0$-90 mT and −200 kHz at $B_o$-150 mT are obtained. While both correspond to about twice the observed value, the longitudinal coupling scheme still provides a better qualitative fit to the experiment than the transverse coupling alone.

Figure 14A:
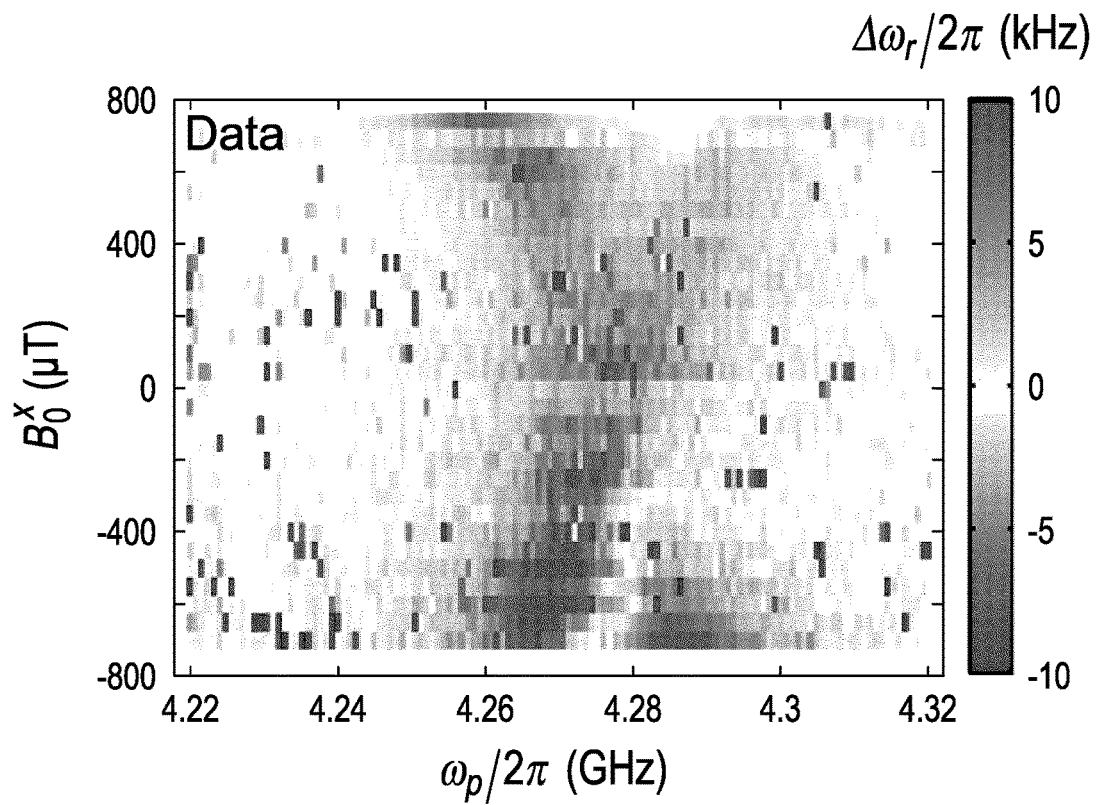
FIG. 14A shows the perpendicular magnetic field dependence of the spectrum of $|g\rangle \leftrightarrow |e\rangle$ spin transition. Amplitude $\Delta\omega_y/2\pi$ of the resonator frequency shift as a function of the pump frequency $\omega_p/2\pi$ and perpendicular magnetic field $B_{0X}$ near the spin transition $|g\rangle \leftrightarrow |e\rangle$ of NV centers of orientations A (top left to bottom right) and B (bottom left to top right). The spin transition frequencies cross at zero field and a clear sign change is observed for one spin orientation for negative field values, expected only from a longitudinal interaction.

In the third experiment, the device is placed in a dilution refrigerator with a vector magnet. There, the in-plane magnetic field is kept at a nominally constant values of $B_{0Y}$-112 mT and $B_{0Z}$-22 mT, while $B_{0X}$ is swept from 750 μT to −700 μT. The measured resonator frequency shift is shown in FIG. 14A where an X-shaped figure appears as the transition frequencies of NV centers of orientations A (top left to lower right) and B (lower left to top right) cross near $B_{0X}$-0. More importantly, we see that $\Delta\omega_r$ changes sign for the A orientation after the crossing and is a telltale sign of a longitudinal coupling dominating the transverse coupling in the dispersive regime.

Figure 14B:
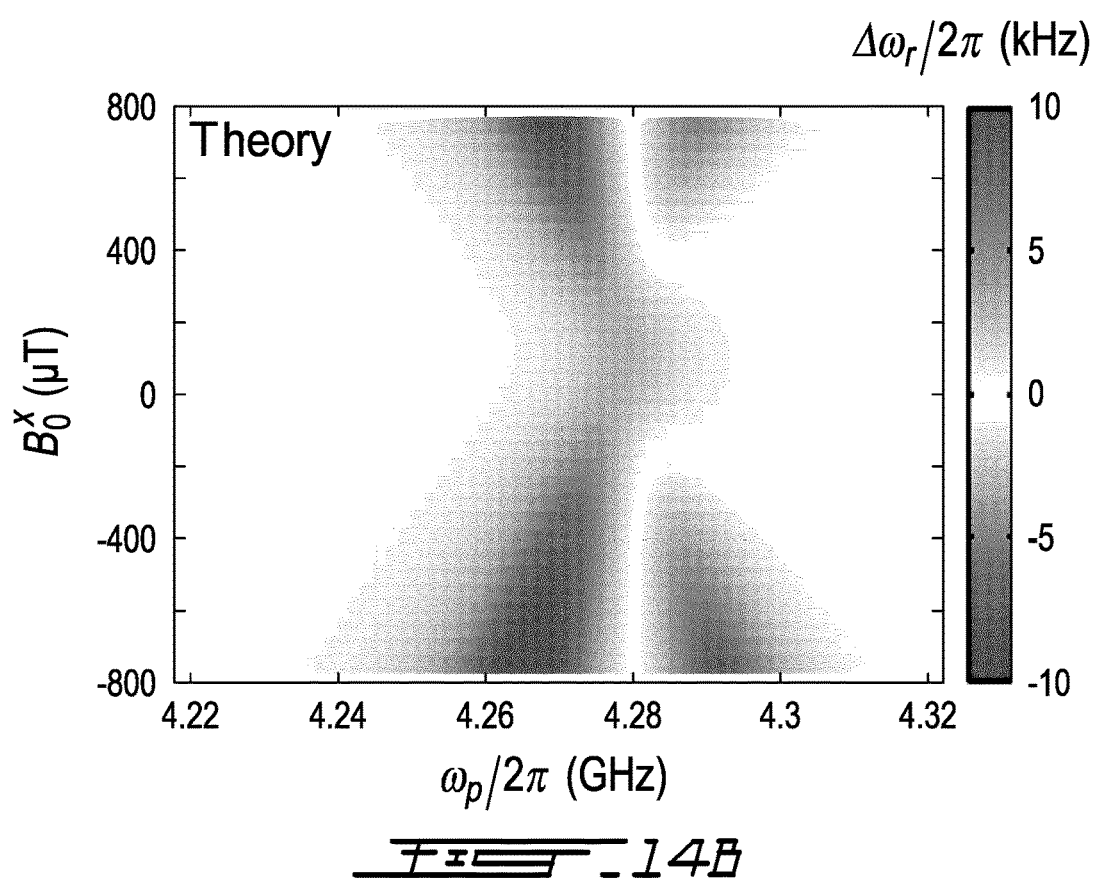
FIG. 14B shows the theoretical calculations of resonator frequency shift from Eq. (15) under transverse and longitudinal couplings. The qualitative and quantitative agreement with the experiment shown in FIG. 14A is good and demonstrates the presence of a longitudinal coupling dominant over the transverse coupling in the dispersive regime.

Indeed, by tuning the perpendicular magnetic field from positive to negative values, we directly tune the sensitivity of the resonator while the spin transition frequency is only slightly affected. In doing so, the detuning is kept almost constant so the dispersive shift from the transverse interaction remains almost unchanged and negative throughout. The longitudinal shift, however, is directly proportional to $E_{0X}$ and therefore must change sign across $B_{0X}$-0 and can overcome the residual dispersive shift. Our theoretical simulations also support our claim as the resonator shift calculated from the system Hamiltonian Eq. (15), shown in FIG. 14B, is both qualitatively and quantitatively similar to the experimental data. From the theory we extracted $|\delta E_X| \approx 430$ nT and we took $\hat{S}_X \to \hat{S}_X + \zeta_Y \hat{S}_Y + \lambda_Z \hat{Z}$ with $\zeta_Y$-−0.1 and $\zeta_Z$-0.1.

Given that the experiment was performed using different equipment and calibrations then the previous experiments, we can expect different populations of the spin states under the pump tone and may explain part of the discrepancy in the fitted parameters.

Theoretical calculations for high-kinetic inductance superconducting resonators

We consider a $\lambda/2$ coplanar waveguide resonator defined in superconducting niobium film of thickness d with a central conductor of width w spaced from the ground plane by a spacing of width s. The impedance Z and the angular frequency $\omega_r$ of the fundamental mode of the resonator are given by $$Z = \sqrt{\frac{L_m + L_K}{C}}, \quad \omega_r = \frac{\pi}{\ell_r \sqrt{(L_m + L_K)C}} \quad (21)$$

where $\ell_r$ is the length of the resonator, $L_m$ is the geometrical inductance per unit length and C is the capacitance per unit length. The kinetic inductance per unit length $L_K$ is given by $$L_K = \mu_0 \frac{\lambda^2}{wt} g(w, s, t), \quad (22)$$

where $\lambda$ is the penetration depth of the superconducting film and g(w,s,t') is a geometrical factor.

Figure 15:
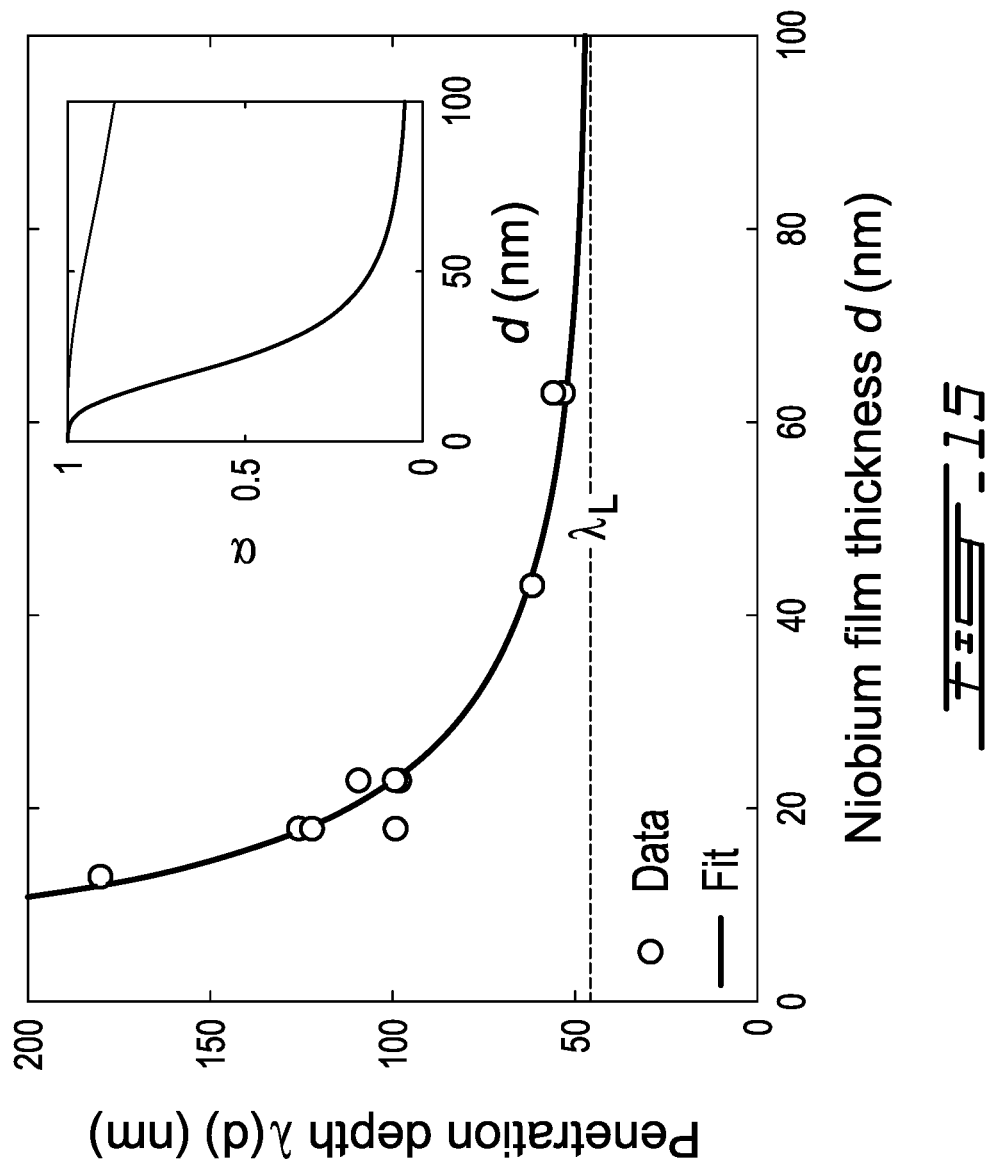
FIG. 15 schematizes penetration depth $\lambda(d)$ as a function of the niobium film thickness d determined experimentally from different superconducting microwave resonators. The black line shows a fit of the data to Eq. (23) from which $\lambda_L$=49±2 nm is determined. Inset: ratio $\alpha$-$L_K/(L_m+L_K)$ as a function of d for w=10 μm and s=6.8 μm (black line) and w=2 μm and s=20 μm (grey line).

The kinetic inductance depends on the ratio of $\lambda^2$ and the area wt of the cross-section of the central conductor. The penetration depth $\lambda$ depends on the temperature T and the amplitude of the perpendicular magnetic field $B_{0X}$. Furthermore, we empirically find that, at zero temperature, the penetration depth depends on the thickness d of the niobium film according to $$\lambda(d) = \lambda_L \coth\left(\frac{d}{\lambda_L}\right) \quad (23)$$

where $\lambda_L$ is the London penetration depth. The thickness-dependent penetration depth $\lambda(d)$ obtained experimentally for different superconducting niobium resonators is fitted to Eq. (23) to determine $\lambda_L$=49±2 nm, very close to the bulk value of niobium of $\lambda_L$-39 nm (FIG. 15). As shown in the inset of FIG. 15, for a niobium film of thickness d-10 nm, more than α=94% of the total inductance is a magnetic-field dependent kinetic inductance. This ratio can be increased to α=99.96% for a very reasonable decrease of the width w of the central conductor.

Additional details about experimental setup

The $\ell_r$=6 mm long resonator used in the experiment presented above is fabricated from a d-18 nm thick niobium film on an insulating GaAs substrate. The central conductor width and spacing are nominally w-10 μm and s-6.8 μm respectively, corresponding to a characteristic impedance Z=97Ω. From the resonator frequency $w_r/2\pi$-5.12% GHz extrapolated at zero temperature, the penetration depth $\lambda$-122 nm and the kinetic inductance ratio a-0.71 are determined. The input and output coupling capacitors to coplanar waveguides lead to external coupling rates of $K_{in,out}/2\pi$≈0.21 MHz. Furthermore, internal losses of the resonator of $\eta_{int}/2\pi$=0.43 MHz at zero field are limited by dielectric losses from the GaAs substrate. The total linewidth $\eta/2\pi$= $(\eta_{in}+\eta_{out}+\eta_{int})/2\pi$≈0.86 Mhz.

The high concentration of NV centers is obtained by implanting a CVD diamond sample (0.3×1.5×1.5 mm³) from Element6™ with less than 1 ppm of nitrogen and a typical NV centers density of $2\times10^{18}$ NV/cm³. Following implantation with protons at 10 MeV (dose of $4\times10^{10}$ ions/cm²), the sample is thermal annealed at 800° C. for 2 hours and 1000° C. for another 2 hours under an argon atmosphere to allow vacancies to migrate and form additional NV centers. Based on photoluminescence measurements, we estimate that the implantation and annealing steps increase the density of NV centers by a factor of $10^8$.

The diamond is fixed at the surface of the resonator with vacuum grease (FIG. 16A). The presence of the diamond and the grease decrease the resonator frequency from $\omega_r 2\pi$≈5.115 GHz to 4.984 GHz and increases the internal losses by about 0.1 MHz. The resonator is fixed in a dilution refrigerator at a base temperature T-10 mK. FIG. 9B shows the simplified experimental setup used in the experiment. A vector network analyser is used to measure the transmission coefficient $t(\omega_s)$ of the resonator at a spectroscopy angular frequency $\omega_e$ and power $P_s$. A pump tone of angular frequency $\omega_p$ and power $P_p$ from a microwave source is combined to the spectroscopy tone at the mixing chamber with a directional coupler. The attenuation of the spectroscopic and pump tones between microwave sources and the input of the resonator are estimated at 5 GHz to about 97 dB and 21 dB, respectively. Cryogenic and room-temperature HEMT amplifiers are used to amplify the spectroscopy tone by about 80 dB.

The magnetic field fluctuations produced by a single spin $\hat{S}$ are given by $$B(r) = \frac{g^* \mu_B \mu_0}{4\pi} \left( \frac{3r(\langle\hat{S}\rangle \cdot r)}{|r|^5} - \frac{\langle\hat{S}\rangle}{|r|^3} \right) \quad (24)$$

where $\langle S \rangle = \langle i|\hat{S}|i\rangle$ denotes the expectation value of a given spin state.

The magnetic field fluctuations perpendicular to the kinetic inductance plane are then given by $\delta B_X(r) = B(r) \cdot e_X$ where $e_X$ is the unit vector normal to the kinetic inductance plane, i.e. along the X axis (FIG. 16). Separating contributions from each component of the spin operator, $\delta B_X(r')$ can be written as $$\delta B_X(r) = \beta_X(r)\langle\hat{S}_X\rangle + \beta_y(r)\langle\hat{S}_Y\rangle + \beta_Z(r)\langle\hat{S}_Z\rangle \quad (25)$$

For any given position r, $\delta B_X(r)$ will have contributions not only from $\hat{S}_X$, as discussed in the main text, but from $\hat{S}_Y$ and $\hat{S}_Z$ as well.

The perpendicular magnetic field $\delta B_X$ along the resonator underneath the sample can be theoretically estimated by discretizing the sample in unit cells of volume $\Delta V$, each containing an average of n-ρΔV spins. At a position $r_0$ from the center of the resonator, the perpendicular component of the magnetic field of a unit cell at a position r is n×$\delta B_X(r-r_0)$. Summing over all unit cells allows of obtain the perpendicular component of the total field produced by the spin ensemble at a specific position Z along the resonator.

Figure 17:
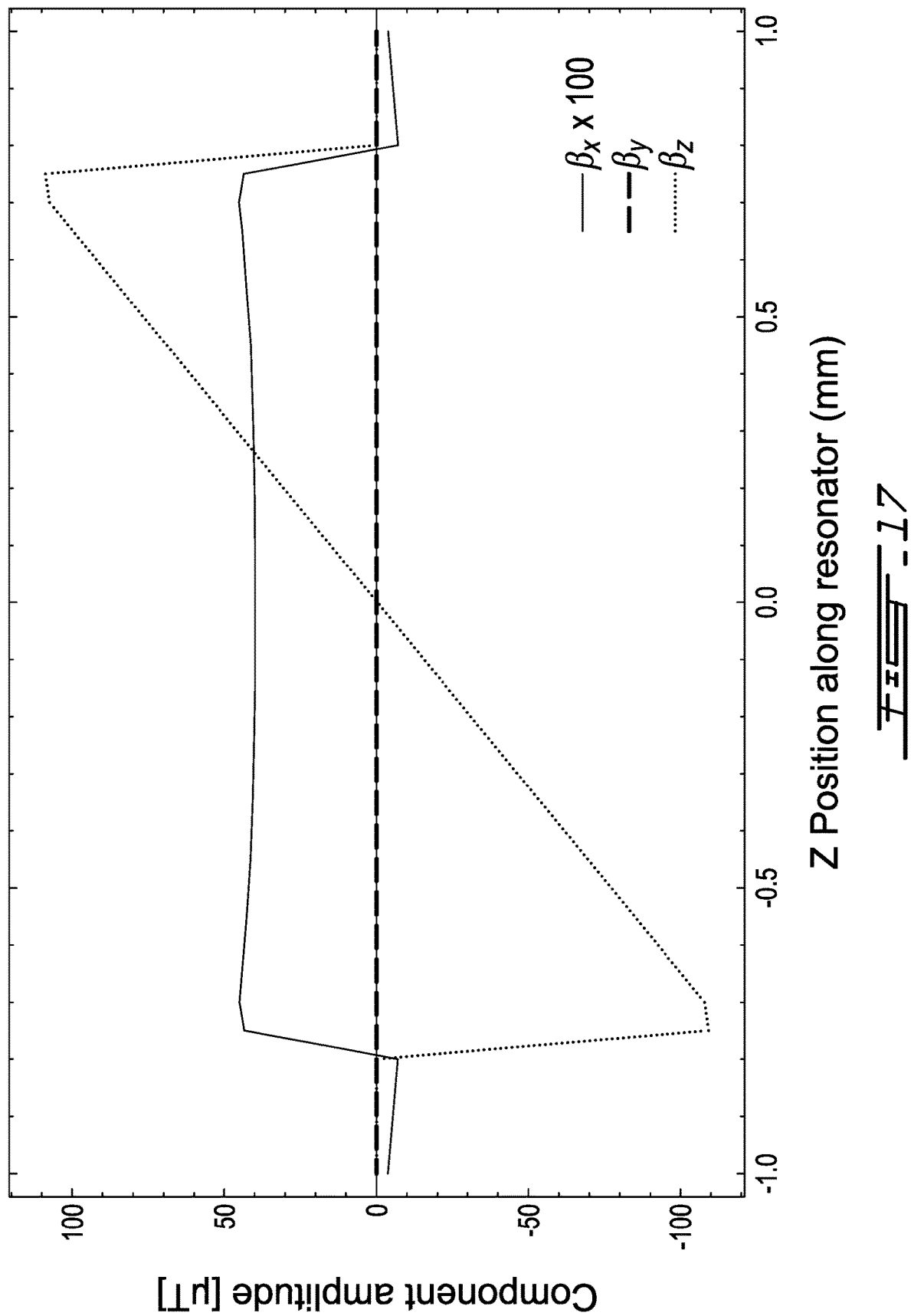
FIG. 17 illustrates the contributions from the different spin projections $\beta_X$, $\beta_Y$, $\beta_Z$ to the perpendicular field fluctuations $\delta\beta_X$ produced by a spin ensemble on the resonator, as a function of the position Z along the resonator. While the $\beta_Z$ contribution can dominate, it averages out over the resonator and only a relatively homogeneous field of ≈400 nT along the X axis remains. In the simulations the ensemble dimensions are (0.30×1.60×1.60) mm³ and is placed 4 μm above the resonator surface.

FIG. 17 shows the different contributions $\{B_X, B_Y, B_Z\}$ as a function of the position Z along the resonator central electrode for a spin ensemble with the sample parameters given in Sect. 3 positioned 4 μm above the resonator surface. As we can see, the contribution varies only lightly over the resonator while $\beta_Z$ can easily dominate. Unsurprisingly, $\beta_Y \approx 0$ given that we are calculating the field at Y-0. If we assume that the sample is placed nominally at the center of the resonator along the Z axis, it can be assumed that $\beta_Z$ averages out to zero, leaving $\beta_X$ as the dominant contribution to the longitudinal interaction, as mentioned above and recovering Eq. (12).

From our simulations we can also estimate the sample volume that influences most of the resonator by calculating the field contribution $\beta_X$ while shrinking the sample size along all three directions (not shown). We estimate the dominant field comes from a sample volume of (0.06×0.03×1.50) mm³ above the resonator, corresponding to 1/250 of the total ensemble and to ~5×10¹⁰ spins.

As can be understood, the examples described above and illustrated are intended to be exemplary only. For instance, in the detailed example presented above, the superconducting element used is a superconducting resonator, and more specifically a superconducting coplanar waveguide resonator. Depending on the embodiment, it may be preferred to detect the change in the spin state by sensing a change of amplitude, or by sensing a change of phase in the transmitted and/or reflected electromagnetic waves for instance. In alternate embodiments, other types of resonators can be used, such as a lumped element or a microstrip for instance. Moreover, in theory, it appears possible to use a waveguide guiding electromagnetic waves in transmission, such as a microwave signal for instance, rather than a resonator. Changes in the magnetic field stemming from spin transitions in the sample may likely cause a change of impedance in the waveguide which may be detected in the form of changes in phase and/or amplitude of the electromagnetic waves travelling in the waveguide. Moreover, while a typical embodiment will use a variable frequency source of electromagnetic radiation, distinct from the source of energy which generates the electromagnetic waves conveyed by the superconducting element, to allow scanning the sample in frequency for electron spin transitions in addition to scanning in magnetic field strength, it is not to be excluded that in some embodiments, it may nonetheless be preferred to use a non-variable frequency source for stimulating spin transitions, and perhaps use the same source of electromagnetic radiation for simultaneously stimulating the spin transitions and driving the electromagnetic waves in the superconducting element. Moreover, it will be noted that in alternate embodiments, the orientation of the magnetic field relative to the kinetic inductance plane can vary, and the amplitude of the magnetic field strength oriented normal to the kinetic inductance plane can vary greatly depending on the perpendicular magnetic field threshold at which the specific superconducting element stops being superconducting, or whose resonating frequency tends towards zero, for instance. In the example presented above, the perpendicular magnetic field threshold was around 8 mT, but this threshold will vary depending on the specificities of the superconducting element and design of alternate embodiments. In the context of the sensitivity of the equipment in the example presented above, it was preferred to apply a magnetic field component normal to the kinetic inductance plane of at least 0.1 mT, preferably at least 0.25 mT, but it will be understood that in alternate embodiments, the strength of the magnetic field normal to the kinetic inductance plane may be satisfactorily below 0.1 mT, if sufficient sensitivity is achieved. Moreover, in some embodiments, it may not be required to apply an external magnetic field normal to the kinetic inductance plane, such as in cases where the magnetic field of the sample is sufficient, for instance. In particular, in alternate embodiments, it can be desired to use a superconducting element which has a magnetic field threshold as high as possible, with all other relevant variables being equal, and to increase the amount of magnetic field strength oriented normal to the kinetic inductance plane to the extent permitted by the associated threshold. It will also be reiterated that longitudinal coupling between spins and a superconducting element exhibiting kinetic inductance is not limited to electron spins, and can be harnessed with other types of spins. For instance, rather than being harnessed for sensing electron spin, the longitudinal coupling can be likely be harnessed for sensing atomic nuclei spin, spin waves, or spin qubits. The transition in spin is not necessarily a complete inversion between states of opposite spin orientations; other changes in spin may also be detectable. Accordingly, the scope is indicated by the appended claims.

What is claimed is:

1. A system for sensing spins in a sample, the system comprising: a magnetic field generator configured to generate an energy difference between different spin states in the sample, an electromagnetic radiation source configured to induce a spin transition in the sample based on the energy difference between the different spin states; a superconducting element configured to exhibit kinetic inductance and having a sensing surface exposed to a magnetic field of the spins in the sample in a manner for the spin transition to cause, via kinetic inductance, a change in electromagnetic waves carried by the superconducting element; and a detector configured to detect the change in the electromagnetic waves.

2. The system of claim 1, further comprising an energy source, distinct from the electromagnetic radiation source, configured to generate the electromagnetic waves in the superconducting element.

3. The system of claim 1 wherein the superconducting element has a magnetic field threshold corresponding to a magnetic field strength perpendicular to the sensing surface, wherein the magnetic field has a component in a plane of the sensing surface, and a component normal to the sensing surface, said component normal to the sensing surface being lesser than the magnetic field strength corresponding to the magnetic field threshold.

4. The system of claim 1 wherein the superconducting element is a superconducting resonator, and wherein the detector is configured to detect a change in resonance frequency of the superconducting resonator.

5. The system of claim 1 wherein the electromagnetic radiation source is a variable frequency source and is connected to a controller configured to change the frequency.

6. The system of claim 5 further comprising a computer configured to perform a frequency scan via the controller, and further configured to receive the signal from the detector and to store a value stemming from the detector signal together with a value indicative of the corresponding frequency into a memory.

7. The system of claim 6 wherein the magnetic field generator has a variable magnetic field strength and is connected to a controller configured to change the magnetic field strength, wherein the computer is further configured to perform said frequency scan for a plurality of magnetic field strength, and to store the value stemming from the detector further with a value indicative of the corresponding magnetic field strength.

8. A method of sensing spins in a sample, the method comprising generating a magnetic field causing a difference of energy level between different spin states in the sample, inducing a spin transition in the sample by exposing the sample to electromagnetic radiation of an energy level corresponding to the difference in energy level between the different spin states; exposing a sensing surface of a superconducting element to a magnetic field of the spins in the sample, the spin transition causing, via the kinetic inductance, a change in electromagnetic waves carried by the superconducting element; and detecting the change using a detector.

9. The method of claim 8 wherein the spin sensed is an electron spin orientation, the exposing the sample includes exposing electrons of the sample to electromagnetic radiation of an energy level corresponding to the difference in energy level between opposite spin states of said electrons, and the exposing the sensing surface includes exposing the sensing surface to a magnetic field of the spins of the electrons.

10. The method of claim 8 wherein the superconducting element is a superconducting resonator, further comprising inducing said superconducting element into resonance at a given resonance frequency via said electromagnetic waves, and wherein the change in the electromagnetic waves is a change in the resonance frequency.

11. The method of claim 10 further comprising, using a computer, varying the frequency of the electromagnetic radiation from frequencies below said energy level, across a frequency of said energy level, and to frequencies above said energy level, or vice-versa, while measuring the resonance frequency and storing said measured resonance frequency values in association with corresponding frequency values.

12. The method of claim 11 further comprising, using the computer, varying the strength of the magnetic field, repeating said varying, measuring and storing for a plurality of magnetic field strength values, and wherein said storing further comprises storing said measured frequency values in association with corresponding magnetic strength values.

* * * * *